United States Patent
Starov et al.

(10) Patent No.: US 6,333,268 B1
(45) Date of Patent: Dec. 25, 2001

(54) METHOD AND APPARATUS FOR REMOVING POST-ETCH RESIDUES AND OTHER ADHERENT MATRICES

(75) Inventors: Vladimir Starov, Los Gatos; Shmuel Erez, San Jose; Syed S. Basha, Pleasanton; Arkadiy I. Shimanovich, San Francisco; Ravi Vellanki, San Jose; Krishnan Shrinivasan, San Jose; Karen A. Reinhardt, San Jose; Aleksandr Kabansky, Santa Clara, all of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/630,231

(22) Filed: Aug. 1, 2000

(Under 37 CFR 1.47)

Related U.S. Application Data

(62) Division of application No. 09/397,956, filed on Sep. 17, 1999, now Pat. No. 6,228,563.

(51) Int. Cl.$^7$ .............................. G03F 7/36; H01L 21/302
(52) U.S. Cl. .......................... 438/691; 438/704; 438/715; 438/746; 216/63; 216/73
(58) Field of Search ................................... 438/691, 704, 438/715, 746; 216/63, 73

(56) References Cited

U.S. PATENT DOCUMENTS

| | | | |
|---|---|---|---|
| 3,962,004 | * | 6/1976 | Sonneborn .......................... 438/746 |
| 6,124,214 | * | 9/2000 | Hembree et al. .................... 438/746 |

* cited by examiner

*Primary Examiner*—Hoa Van Le
(74) *Attorney, Agent, or Firm*—Roland Tso

(57) ABSTRACT

Adherent matrix layers such as post-etch and other post-process residues are removed from a substrate by exposing them to a vapor phase solvent to allow penetration of the vapor phase solvent into the adherent matrix layers and condensing the vapor phase solvent into the adherent matrix layers and revaporized to promote fragmentation of the matrix and facilitate removal. Megasonic energy may be transmitted via a transmission member to the adherent matrix through the solvent condensed thereon to loosen fragments and particles. The substrate is typically rotated to improve contact between the megasonic energy transmission member and the condensed solvent and achieve more uniform cleaning. A co-solvent which is soluble in the vapor phase solvent may be added to enhance removal of specific adherent matrix materials. A plasma pretreatment may be employed to react with and modify the matrix in a way that improves subsequent penetration by the vapor phase solvent and fragmentation of the adherent matrix for more complete removal from the substrate.

10 Claims, 29 Drawing Sheets

METHOD AND APPARATUS FOR REMOVING POST-ETCH RESIDUES AND OTHER ADHERENT MATRICES

This application is a divisional of U.S. patent application Ser. No. 09/397,956 filed on Sep. 17, 1999, now U.S. Pat. No. 6,228,563 the entire disclosure of which is incorporated herein by reference.

BACKGROUND OF THE INVENTION

The present invention relates generally to methods and apparatus for removing adherent layers from substrates, and more particularly to methods and apparatus for removing residues from semiconductor wafers, including post-etch, post-ash, and other post-process residues.

The fabrication of integrated circuits and other devices on semiconductor wafers depends on the photolithographic patterning of successive layers of materials applied on and into the wafer. In each photolithographic step, a layer of photoresist is applied to the wafer, soft baked, and patterned by exposure to radiation through a precisely aligned mask. Such exposure alters the solubility of the resist material in a particular solvent, thus allowing selective removal of the resist in accordance with the pattern defined by the mask. After the subsequent fabrication steps are completed, it becomes necessary to remove the remaining insoluble photoresist to permit further fabrication. In some cases, the photoresist may be rendered insoluble to common solvents by the fabrication step which has been performed. For example, ion implantation, radiation accompanying plasma etching, and any other process raising the wafer temperature above 150° C. to 200° C. for a significant period of time, will frequently cause the photoresist material to become heavily cross-linked, making it particularly difficult to remove.

During photolithography, a photoresist mask is formed on a semiconductor substrate. A hard, cross-linked polymeric crust is typically formed at the top of the photoresist and residues are formed along the walls of any trenches or vias during subsequent processing. For instance, impurities, such as P, B, and As, may be bonded chemically with the photoresist polymer during ion implantation, and the surface layer of the photoresist mask will change in quality and become a very hard layer known as a carbonized layer. The photoresist polymer inside the photoresist mask beyond the reach of impurities will remain as an unchanged layer.

In addition to cross-linking, contamination of a photoresist layer during a wafer fabrication step can also reduce its solubility. For example, when photoresist is used for patterning a silicon dioxide or aluminum layer during plasma etching, the organic photoresist material may become contaminated by silicon, aluminum, or other inorganic materials. Such contaminated photoresists are frequently refractory to normal solvent removal.

Some techniques of removing refractory photoresists involve thermal and photochemical oxidation of the photoresists. Such oxidation typically requires elevated temperatures, which can cause undesired diffusion within the wafer, and can cause sputtering of the metallic components made of, e.g., aluminum and titanium nitride. Oxidation of such metallic components will form metal oxides such as aluminum or titanium oxides, which are ceramic residues that are extremely difficult to remove. Others employ low temperature "ashing" in an oxygen plasma, which has the disadvantage that the plasma discharge required can result in damage to the wafer substrate. Wet oxidative stripping of insoluble photoresists has also been used. Such wet stripping techniques, however, often require temperatures above 150° C. to be effective.

In U.S. Pat. No. 5,201,960 to Starov, which is incorporated herein by reference in its entirety, a densified fluid cleaning method for removing adherent matrices involves exposing the matrix to a vapor phase solvent to allow the solvent to penetrate the matrix and then condensing the vapor to physically disrupt the adherent matrix to promote fragmentation of the matrix and facilitate removal. The solvent typically used is ammonia. While this dry cleaning method has the advantages of lower cost, improved safety, and reduced environmental impact, it is sometimes not effective in completely removing post-etch or other post-process residues. For instance, the interaction between ammonia and the photoresist can be quite slow, making the removal of thick photoresist layers difficult. In cases where there is a stubborn polymeric crust on top of the photoresist, the stresses produced during interaction with ammonia may cause curling or rolling of the polymeric crust and the underlying photoresist, resulting in macroscopic flakes over the substrate surface. Thus, there is a need for more effective methods and apparatus for removing adherent matrix layers such as post-etch or other post-process residues.

SUMMARY OF THE INVENTION

The present invention is useful for removing a wide variety of adherent matrix layers which have been deposited over substrates, including both organic and inorganic matrix layers, and is particularly useful for removing cross-linked organic polymers which have limited solubility in, but are penetrable by, certain chemical and/or physical solvents. The present invention will find its greatest use in removing highly cross-linked photoresist present over semiconductor wafers, where removal has heretofore generally required either high temperature oxidation, plasma ashing, or combinations of both. The present invention can achieve removal of even highly refractory cross-linked photoresists, such as photoresists that have been hardened by exposure to certain wafer fabrication processes, at relatively low temperatures without exposure of the wafer substrate to potentially damaging radiation.

The present invention is particularly useful as a part of otherwise conventional photolithographic processes for transferring patterns from a mask containing circuit-design information to the surface of a silicon wafer. In such processes, the wafer is first coated with a substantially continuous layer of photoresist which is then soft-baked to remove residual solvents, promote adhesion, and harden the resist. The resist is then exposed using a radiation source, usually a light source or electron beam source, through the preformed mask or by projection printing to selectively alter the characteristics of well-defined portions of the photoresist. In the case of negative photoresists, an activator within the organic polymer matrix absorbs the radiation which in turn promotes cross-linking of the polymer. The cross-linked areas inhibit solubilization in the subsequent development step. In the case of positive photoresists, an inhibitor is present that prevents wetting and attack by the developer. Exposure to the radiation degrades the inhibitor, thus allowing the exposed regions to be removed upon subsequent exposure to the developer. After development, i.e., removal of the more soluble regions of the photoresist layer to expose the wafer thereunder, the photoresist is usually further baked to improve surface adhesion, increase the strength of the matrix, and drive off volatiles that have been retained from the developer. The patterned photoresist is then ready for use in a subsequent wafer fabrication operation, such as plasma etching, wet etching, ion implantation, sputtering, electroplating, and the like. Many of these processes will result in further cross-linking or otherwise hardening of the remaining photoresist layer, rendering the layer refractory to many removal techniques. The present invention is advantageously used as a stripping process for removing the residual photoresist material after the desired wafer fabrication step has been completed.

Specific embodiments of the present invention provide more effective methods and apparatus for removing adherent matrix layers such as post-etch residues. Some embodiments of the invention employ a plasma pretreatment to remove the bulk photoresist as well as much of any polymeric crust that is present from the substrate surface, followed by a densified fluid cleaning step to substantially remove completely the remaining residues. The plasma pretreatment modifies the photoresist and residues in a way that facilitates their complete removal by the subsequent densified fluid cleaning step. The plasma pretreatment does so by chemically reacting the plasma species with the photoresist and residues and by mechanically altering the photoresist and residues, fragmenting them and/or making them more porous. In this way, the vapor phase solvent can penetrate more readily into the photoresist and residues and react with them more effectively during the densified fluid cleaning step to achieve complete removal.

In some embodiments, high frequency sonic energy is employed to agitate the densified fluid to help loosen particles and residues from the adherent matrix, thereby enhancing the removal process. In a specific embodiment, a megasonic probe is used to contact the densified fluid on the adherent matrix to transmit megasonic energy into the adherent matrix.

A co-solvent may be added to provide improved removal of the adherent matrix. The co-solvent is typically introduced substantially simultaneously with the vapor phase solvent, and may be introduced in liquid form or vapor form. The co-solvent is preferably soluble in the vapor phase solvent so that the vapor phase solvent can act as a carrier for the co-solvent during penetration into the adherent matrix and subsequent evaporation.

One aspect of the present invention is directed to a method of removing an adherent matrix from a substrate surface of a substrate. The method includes exposing the adherent matrix on the substrate to a plasma-activated gas which reacts with the adherent matrix, and separating the substrate from the plasma-activated gas. The adherent matrix is exposed to a vapor phase solvent to allow penetration of the vapor phase solvent into the adherent matrix. The vapor phase solvent is condensed after penetration into the adherent matrix to disrupt the adherent matrix to produce fragments. The fragments are removed from the substrate surface. The plasma-activated gas may be generated in situ inside a chamber in which the substrate is disposed, or in a remote plasma generating region.

In some embodiments, the substrate is placed in a second chamber and a preselected chamber temperature is maintained within the second chamber. The vapor phase solvent is delivered to the second chamber at a solvent delivery temperature above the chamber temperature and at a pressure below the saturation vapor pressure of the solvent at the chamber temperature, and the vapor phase solvent has a vapor pressure of at least three atmospheres at room temperature. The pressure of the vapor phase solvent within the second chamber is increased from an initial value below the saturation vapor pressure to a subsequent value above the saturation vapor pressure, whereby the vapor phase solvent initially penetrates the matrix while in the vapor phase and thereafter condenses to physically disrupt the matrix to produce the fragments. The pressure in the second chamber is decreased to a value below the saturation vapor pressure, whereby the liquid phase solvent revaporizes to further physically disrupt the adherent matrix. In specific embodiments, the steps of increasing and decreasing the pressure are repeated at least once.

In some embodiments, the adherent matrix is exposed to a co-solvent to allow penetration of the co-solvent into the adherent matrix. The co-solvent may be a vapor or a liquid. Examples of co-solvents include hydroxylamine, n-methylpyrilodone, $NH_4F$, $NH_4Cl$, $NH_4Br$, $(CH_3)_3NHF$, EDTA, and ethylene glycol.

The substrate may be rotated while exposing the adherent matrix to the vapor phase solvent and condensing the vapor phase solvent. In specific embodiments, sonic energy is transmitted to the adherent matrix through the solvent condensed on the adherent matrix. The vapor phase solvent may be collected after processing, purified, and recirculated and reused for removing the adherent matrix. In some embodiments, a purge is performed in the chamber prior to exposing the adherent matrix to the vapor phase solvent using an inert gas. The purge removes oxygen and water moisture to reduce or eliminate oxidation of materials in the substrate such as copper.

In accordance with another aspect of the invention, a method of removing an adherent matrix from a substrate surface of a substrate includes placing the substrate in a cleaning chamber, and delivering a vapor phase solvent to the cleaning chamber to allow penetration of the vapor phase solvent into the adherent matrix. The substrate is cooled to a substrate temperature which is sufficiently low to condense the vapor phase solvent into the adherent matrix to disrupt the adherent matrix to produce fragments. Sonic energy is transmitted to the adherent matrix through the solvent condensed on the adherent matrix to loosen fragments and particles on the substrate.

In some embodiments, transmitting sonic energy includes placing a transmission member in contact with the condensed solvent and vibrating the transmission member. The transmission member comprises an elongated probe which contacts a portion of the condensed solvent on the adherent matrix. The substrate is rotated so as to bring the elongated probe in contact with at least a substantial portion of the condensed solvent on the adherent matrix. In a specific embodiment, the elongated probe is extended from an edge of the substrate to generally a center of rotation of the substrate.

In accordance with another aspect of this invention, an apparatus for cleaning a substrate includes a process chamber having a gas inlet and a gas outlet, and a platen disposed inside the process chamber for supporting a substrate. A sonic transmission member is disposed at least partially inside the process chamber. A positioning mechanism is coupled with the sonic transmission member for positioning the sonic transmission member adjacent a surface of the substrate and adjusting a spacing between the sonic transmission member and the substrate surface.

A rotating mechanism may be provided for rotating the platen. In some preferred embodiments, a cooling device is provided for cooling the platen and a heating device is provided for heating the chamber walls. In a specific embodiment, the process chamber includes a door and a purge device is provided outside the process chamber adjacent the door for directing a flow of an inert gas across the outside of the door.

DESCRIPTION OF THE SPECIFIC EMBODIMENTS

I. Introduction

The present invention provides an integrated approach for removing adherent matrix layers such as post-etch or other post-process residues by a plasma pretreatment followed by a densified fluid cleaning (DFC) step. Plasma species react with the adherent matrix to remove a portion of the matrix and to alter the matrix chemically and mechanically to make it more amenable to attack by a vapor phase solvent during the DFC step. DFC is a dry-source, liquid-mode cleaning method which is based on application of densified gases at elevated pressures and low temperatures. Co-solvents in liquid form or vapor form may be added for more effective cleaning. A megasonic device is typically used during the DFC step to enhance the cleaning action by transferring additional mechanical energy to the adherent matrix.

A. Plasma Pretreatment

The plasma pretreatment process employs plasma to produce reactive species to react with the adherent matrix such as post-etch or other post-process residues to form volatile compounds which are then removed. The plasma pretreatment typically removes a portion, often a substantial portion, of the adherent matrix from the substrate. The plasma pretreatment further modifies the adherent matrix on the substrate in such a way that they are made more amenable to disruption by the solvent during the subsequent DFC process to produce more complete and effective cleaning. It is believed that the plasma helps break down the residue and/or fluorinate the residue for more effective removal during the DFC process.

Figure 1A:
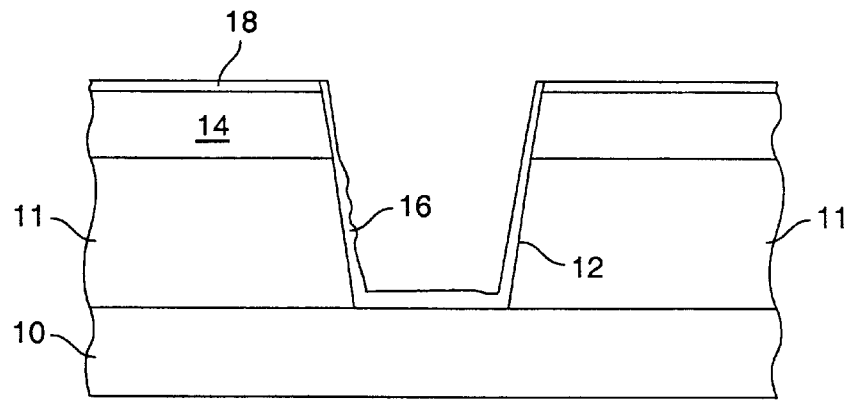
FIGS. 1a–1c are vertical cross-sectional views of a substrate, schematically demonstrating removal of post-etch residue employing a method of the present invention.
Figure 1B:
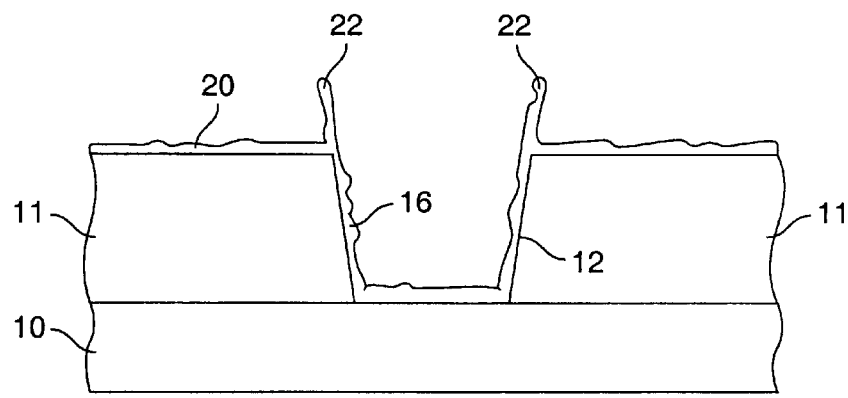
Figure 1C:
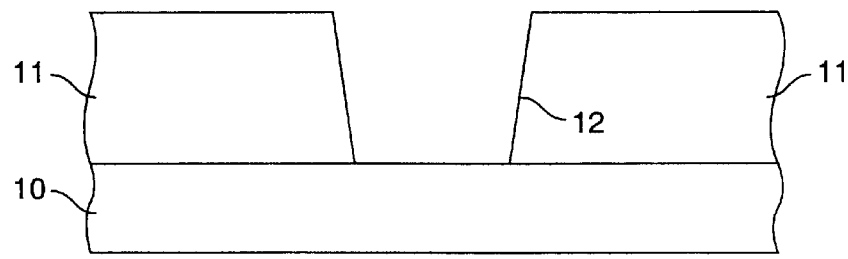

In the example of post-etch residue removal, the plasma pretreatment removes the bulk photoresist. This is schematically illustrated in FIGS. 1A and 1B. In FIG. 1A, the substrate 10 has a trench or via 12 between islands 11. A photoresist layer 14 covers the substrate 10 which typically includes an oxide layer. Polymeric residues 16 are formed at the bottom and sides of the trench or via 12. The substrate 10 typically includes metal such as aluminum and copper. Sputtered residues of the metals may also form in and above the trench 12. A hard polymeric crust 18 is typically formed on top of the photoresist layer 14. As shown in FIG. 1B, the plasma pretreatment removes the bulk photoresist layer 14 and much of the polymeric crust 18, leaving residual portions 20 of the photoresist 14 and crust 18 as well as the polymeric residues 16 on the substrate 10. Sometimes a crown 22 is formed by the residues 16 protruding from the trench or via 12 as illustrated. The plasma species further react with the polymeric residues 16 and the residual portions 20 of photoresist and crust, and at least partially fragment them and/or increase their porosity, making them more amenable to attack by the solvent during DFC. When residual portions of the crust 18 is present, the plasma pretreatment is believed to at least partially fragment the residual crust portions to facilitate penetration of the vapor phase solvent into the residual photoresist portions for more effective cleaning during DFC.

The plasma pretreatment is typically carried out in a processing chamber. A process gas is flowed into a plasma generating region and a plasma is generated by the application of energy such as microwave energy supplied by a microwave source to the gas. The plasma generating region may be inside the processing chamber. The in situ plasma can be generated by a radiofrequency system. Alternatively or additionally, the plasma generating region may be at a remote location and the plasma species generated are flowed into the processing chamber to react with the adherent matrix on the substrate, forming volatile compounds that are then removed by evacuation. A known remote plasma generating apparatus is the microwave downstream (MWD) plasma apparatus. Oxygen and fluorine species are typically generated and used. Examples of suitable process gas mixtures include fluorine-based mixtures $NF_3/O_2$, and $CF_4/O_2/N_2$, or the like, and hydrogen-based mixtures such as $N_2/H_2$ (4 molecular percent), $H_2O$, $NH_3$, or the like. Use of different types of process gas mixtures sequentially in the plasma pretreatment may also be advantageous. The type of process can be selected and optimized for different substrates with different residues.

Low temperature processing down to about 30° C. in the processing chamber is preferred to avoid or minimize oxidizing any metallic residues on the substrate 10 since metallic oxides are extremely difficult to remove. Low temperature processing also minimizes damage to the substrate 10 (such as oxide and metal layers, and antireflective coatings). It is also desirable to provide a low oxidation plasma process by lowering the amount of oxygen-containing gases in the process gas mixture to minimize the formation of metal oxides or the like.

B. Densified Fluid Cleaning Process

The DFC process relies on introducing a condensable solvent in its vapor phase so that it is able to penetrate deep within the matrix. The solvent desirably has a relatively high pressure, typically being at least about one atmosphere, usually being at least about several (e.g., 3) atmospheres at room temperature, so that it can be vaporized and condensed at relatively moderate temperatures. The solvent preferably has a high affinity to the matrix material to enhance solvation and swelling of the matrix.

The particular solvent selected will, of course, depend on the nature of the adherent matrix layer as well as the substrate. Suitable solvents will usually be non-oxidizing at the low temperatures required to practice the DFC process, with exemplary solvents including ammonia, carbon dioxide, carbon monoxide, nitrous oxide, methylamine, dimethylamine, trimethylamine, ethylamine, sulfur hexafluoride, carbon tetrafluoride, hexafluoroacetone, and other hydrocarbons, chlorofluorohydrocarbons, and chlorofluorocarbons, and the like for removal of cross-linked photoresists. The solvent should be volatile, with preferred solvents including ammonia, carbon dioxide, sulfur hexafluoride, and the like. Ammonia is particularly effective and preferred for use in removing photoresist and other cross-linked organic polymeric layers from substrates, such as semiconductor wafers.

Physical characteristics, such as vapor pressure, boiling point, critical temperature, and critical pressure are also important considerations in solvent selection. Vapor pressure and boiling point are important factors in solvent selection because of the desirability for any residual solvent to evaporate quickly from the surface of the substrate after the cleaning process is completed, thus leaving a clean, dry surface. Ammonia, which has a boiling point of –33° C., will leave a dry surface within seconds even at 20° C., while water at that temperature will evaporate only very slowly. The critical temperature of the solvent may affect solvent selection because solvents acquire "gas-like" characteristics when heated far above their critical temperature. Thus, if the critical temperature is much below ambient, very high pressures may be required in order to achieve sufficient densification for cleaning applications. Solvents having very low critical temperature, then, will be less desirable for this use since, as a matter of practicality, it will be easier and less expensive to build a chamber to operate at moderate pressures.

Table 1 lists a number of suitable solvents having physical properties convenient in the practice of the DFC process. The relatively large number of solvents with properties in this range is advantageous in providing a variety of chemical and solvent properties to match the contaminant or contaminants known or suspected to be present on the substrate to be cleaned.

TABLE 1

| Solvent | Formula | Vapor Pressure (atm) at 21.2° C. | Boiling Point (° C.) | Critical Temperature (° C.) | Critical Pressure (atm) |
|---|---|---|---|---|---|
| Ammonia | $NH_3$ | 8.8 | –33 | 132 | 111 |
| Methylamine | $NH_2CH_3$ | 3.0 | –6.3 | 157 | 74 |
| Dimethylamine | $NH(CH_3)_2$ | 1.8 | 6.9 | 165 | 52 |
| Trimethylamine | $N(CH_3)_3$ | 1.9 | 2.9 | 160 | 40 |
| Ethylamine | $NH_2C_2H_5$ | 1.2 | 17 | 183 | 56 |
| Sulfur Hexafluoride | $SF_6$ | 23 | –63.7 (Subl) | 46 | 37 |
| Carbon Dioxide | $CO_2$ | 58 | –78.4 (Subl) | 31 | 73 |
| Carbon Monoxide | CO | — | –192 | –140 | 34.5 |
| Carbon Tetrafluoride | $CF_4$ | — | –128 | –46 | 36.9 |
| Hexafluoro-acetone | $(CF_3)_2CO$ | 6.0 | –28 | 84 | 28 |

In addition to those properties listed and otherwise described, flammability and toxicity of a solvent are factors to consider for safety reasons. The relatively low toxicity and flammability of ammonia, for example, together with its wide use in semiconductor fabrication processes (e.g., silicon nitride CVD, nitridations) helps make ammonia a desirable solvent in the DFC process.

Ammonia possesses desirable physical, chemical, and solvent properties that make it particularly desirable for removing many of the contaminants commonly found in the semiconductor industry using the DFC method. One notable property, for example, is the ability of ammonia to dissolve the alkali metals and their compounds which are common contaminants on silicon wafers. These metals react with liquid ammonia according to the following reaction to form solutions that are relatively stable:

$M+NH_3 \rightarrow MNH_2+0.5H_2\uparrow$.

Further, many organic compounds are soluble in ammonia. For example, alcohols, amines, and esters are miscible in ammonia in all proportions, while aldehydes, ketones, and ethers are largely soluble. Organic acids are generally converted to their corresponding salts in the presence of ammonia, and some of the salts show very high solubility, especially when compared to other inorganic solvents, notably water.

The conditions for introducing the solvent to the adherent matrix are critical. The solvent will be introduced as a vapor, and the conditions should be selected to allow the solvent to remain in the vapor phase for a time sufficient to achieve penetration and wetting of the matrix. Typically, at least 30 seconds, and sometimes two or more minutes are allowed prior to condensation of the vapor phase to the liquid phase. In particular, it is important that the temperature of the substrate and surrounding the substrate be above the dew point at the initial solvent partial pressure and that the solvent vapor pressure be increased sufficiently slowly to delay condensation for the desired vapor exposure time. It has been found that initial condensation of the vapor on the surface of the adherent matrix inhibits penetration of the matrix by the vapor.

Conveniently, the substrate will be maintained within an enclosed chamber having mechanisms for controlling both the temperature and pressure therein. The solvent is delivered to the chamber at a temperature above the initial chamber temperature and at a pressure above the saturation vapor pressure of the solvent at the chamber temperature. In this way, the vapor expands as it enters the chamber with its pressure falling below the saturation vapor pressure during the initial stage of vapor introduction. By limiting exhaust from the chamber, however, the pressure within the chamber will eventually increase to equal the solvent delivery pressure. Thus, as soon as the solvent pressure exceeds the saturation vapor pressure at the chamber temperature, condensation will begin to occur. During condensation, the solvent that has penetrated the matrix becomes densified in a liquid state, and a densified layer of the liquid solvent is formed over the surface of the substrate densification of the solvent may be induced by either raising the pressure inside the chamber, or by reducing the temperature inside the chamber, or both. In practice, densifying the solvent is usually accomplished, at least in part, by increasing the pressure in the chamber, and the temperature is typically controlled to encourage solvation of the contaminants by the densified solvent. The solvent may be densified starting from its vapor, gaseous, or supercritical state and a change of state, from vapor to liquid or from gaseous to supercritical, may occur during densification. A change of state is not require, however, for the DFC method to be effective.

The desired cycle of vapor introduction and condensation can be achieved by properly selecting the chamber temperature, initial chamber pressure, solvent vapor temperature, and initial solvent vapor pressure, and flow rate. Alternatively, a separate pumping system can be used for delivering the solvent vapor to the chamber. Exemplary conditions for removing photoresist with ammonia are set forth in Table 2.

TABLE 2

Conditions for Ammonia Vapor Delivery in Removing Photoresist

| Parameters | Broad Range | Preferred Range |
| --- | --- | --- |
| Platen Temperature | About 15° C.–80° C. | About 25° C.–35° C. |
| Initial Chamber Pressure | About Vacuum–2 atm. | About Atmospheric |
| Solvent Vapor Delivery Temperature | About 40° C.–150° C. | About 50° C.–80° C. |

TABLE 2-continued

Conditions for Ammonia Vapor Delivery in Removing Photoresist

| Parameters | Broad Range | Preferred Range |
| --- | --- | --- |
| Solvent Vapor Delivery Pressure | About 20–2000 psig | About Saturation at the Solvent Delivery Temperature |
| Solvent Flow Rate (average value in reactor volumes per minute at delivery temperature and pressure) | About 0.01–1 | About 0.05–0.5 |

Figure 1D:
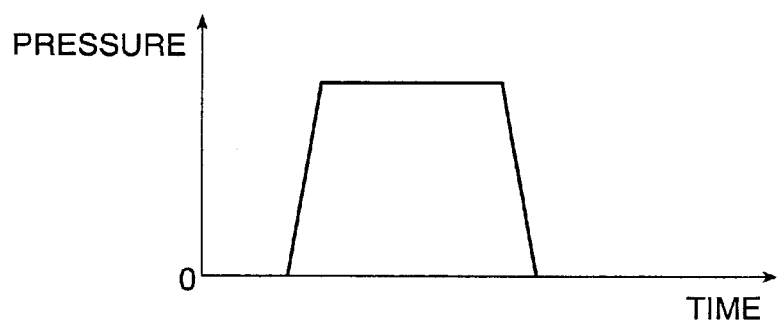
FIGS. 1d–1f illustrate examples of different solvent condensation schemes according to the present invention.
Figure 1E:
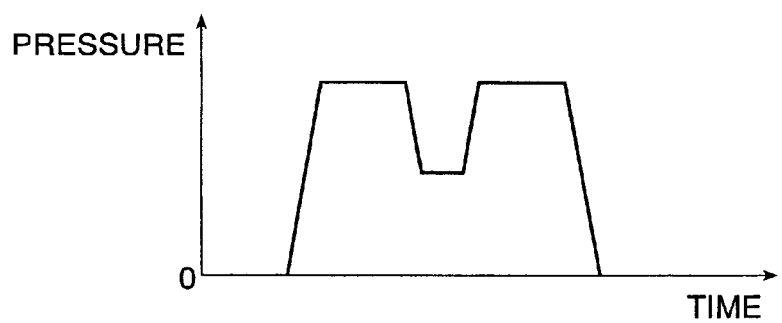
Figure 1F:
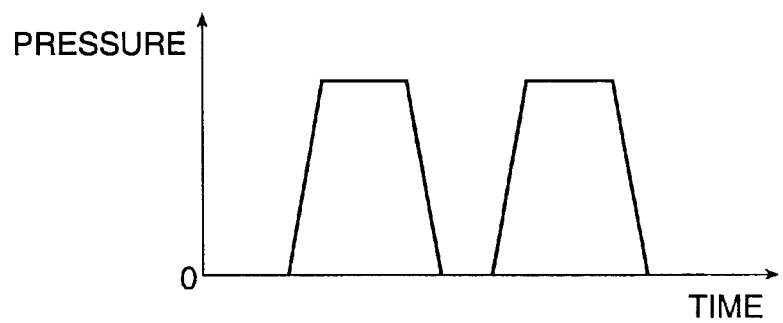

FIGS. 1D–1F illustrate examples of different condensation schemes by varying the pressure over time. In FIG. 1D, the chamber is pressurized from a vacuum level by the solvent vapor to a maximum level. The stable process pressure at the maximum level is maintained for a period of time before the chamber is depressurized.

In FIG. 1E, the pressure is allowed to drop to an intermediate level after initial pressurization and stabilization at the maximum level. The pressure is typically held at the intermediate level for a period of time before repressurization to the maximum level. The pressure is stabilized at the maximum level for another period of time prior to depressurization. FIG. 1F is similar to FIG. 1E but the first depressurization lowers the pressure to the vacuum level instead of the intermediate level in FIG. 1E. The multiple-step depressurization-repressurization in FIGS. 1E and 1F makes use of thermophoresis and is believed to help dislodge particles and residues from the substrate by rapid vaporization of the solvent from a liquid to a gas. It will be appreciated that the scheme of condensation and vaporization can be optimized for different processes involving different solvents, residues, and operating conditions.

In addition, a purge using an inert gas such as nitrogen, helium, or argon is advantageous prior to the DFC process in some situations. For example, a nitrogen purge can be used to purge the chamber of oxygen and water moisture prior to processing a substrate containing a material such as copper which is prone to oxidation. The pre-process purge reduces or eliminates oxidation of the copper.

Moreover, the addition of a co-solvent to the solvent for DFC may provide improved residue removal and cleaning in some cases. The co-solvent is typically introduced substantially simultaneously with the vapor phase solvent, and may be provided in vapor form or in liquid form. The co-solvent is desirably soluble in the vapor phase solvent which acts as a carrier for the co-solvent during penetration into the adherent matrix and evaporation from the adherent matrix. When ammonia is used as the vapor phase solvent, examples of suitable co-solvents include hydroxylamine (HA) and n-methylpyrilodone (NMP), which are effective in dissolving organic materials such as organic photoresists, as well as other polar organic and other similar co-solvents miscible with ammonia. HA and NMP can be introduced either in liquid form or in vapor form. Halides that are miscible with ammonia to form liquids such as $NH_4F$, $NH_4Cl$, $NH_4Br$, and $(CH_3)_3NHF$ may also be added, and appear particularly effective in cleaning silicon oxide substrates. Additional co-solvents include chelating agents such as EDTA and anticorrosion agents containing ethylene glycol, which are typically introduced in liquid form. It will be appreciated that other co-solvents may be used. The specific co-solvent and the amount to be added to the solvent can be optimized for different DFC processes.

C. Mechanical Energy Assisted Cleaning

The present invention desirably enhances the cleaning action during the DFC process by introducing mechanical energy to the substrate. In particular, high frequency sonic energy is employed to agitate the densified layer of liquid solvent which is penetrated into the adherent matrix and formed over the substrate surface in order to help loosen particles and residues on the substrate. Very high frequency sonic energy known as megasonic energy is preferably used. Megasonic cleaning systems typically operate at frequencies of at least about 400 kHz, and often at higher frequencies of about 800–900 kHz. A number of megasonic cleaning systems and methods are disclosed, for example, in U.S. Pat. Nos. 4,804,007, 4,869,278, 4,998,549, 5,037,481, 5,090,432, 5,286,657, 5,365,960 5,534,076, and 5,656,097, and PCT publication WO 98/14985, which are incorporated herein by reference in their entireties.

A piezoelectric transducer is typically used to produce the sonic energy. The transducer is electrically excited to vibrate at a very high frequency. The vibration is transmitted through a transmission member such as a probe to the densified fluid disposed on the substrate surface. The layer of densified solvent which forms over the substrate surface typically has a thickness of about 100–300 µm. For the transmission member to contact the densified solvent, the maximum distance between the transmission member and the substrate surface is also about 100–300 µm. The densified solvent transmits the sonic energy to the substrate and adherent matrix through the regions into which the solvent has penetrated. The sonic energy assists in fragmenting the matrix and loosening particles and contaminants on the substrate to produce more effective cleaning.

The transmission member for transmitting the sonic energy from the transducer to the densified solvent on the substrate surface is typically a probe of relatively small dimensions for concentrating the sonic energy. The probe does not cover the entire area of the substrate surface. Because sonic energy dissipates rapidly with distance, the substrate is preferably rotated to ensure that the entire surface of the substrate is exposed to the sonic energy for improved cleaning. The rotational speed of the substrate is important. If the speed is too high, the layer of densified solvent will diminish in thickness and may lose coupling with the probe. Although the coupling can be maintained by narrowing the distance between the probe and the substrate surface, it is problematic in practice due to the close tolerance that is required to avoid physical contact between the probe and the substrate surface. Typical rotational speed of the substrate is about 20–40 rpm. Alternatively, the transducer probe may be rotated relative to a stationary substrate.

II. An Exemplary System

A. Plasma Cleaning Apparatus

Figure 2:
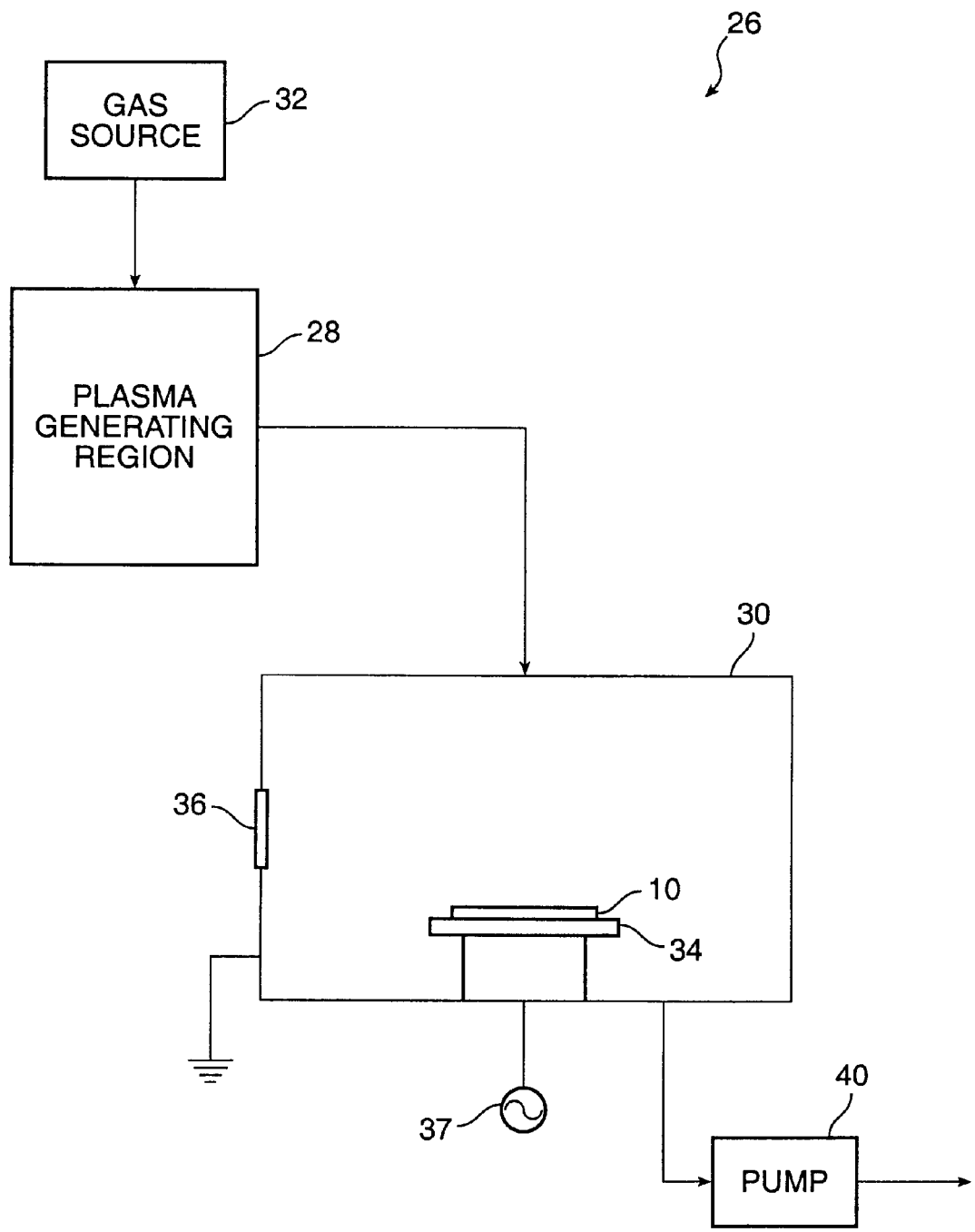
FIG. 2 is a schematic diagram of a microwave plasma cleaning apparatus in accordance with an embodiment of the present invention.

FIG. 2 shows an exemplary embodiment of a plasma cleaning apparatus 26 used for plasma cleaning pretreatment of the adherent matrix. The apparatus 26 includes a remote plasma generating region 28 and a reaction chamber 30. In this embodiment, the plasma is generated by microwave energy transmitted from a microwave power source. A reactive gas supplied from a gas source 32 is introduced into the plasma generating region 28 of the microwave power source where the reactive gas is ionized to form a plasma. Radicals such as oxygen and fluorine species are generated by the effect of microwave electric field, and are flowed from the remote plasma generating region 28 to the reaction chamber 30. The substrate 10 to be processed is placed on a platen 34 inside the reaction chamber 30. The platen 34 is typically heated to a desired temperature. The platen 34 is movable for receiving the substrate 10 introduced through the chamber door 36 by a robot. The radicals react with the substrate 10 in the reaction chamber 30.

Although the reactive species can be generated in the remote plasma generating region 28, the apparatus 26 may also include an in situ radiofrequency (RF) plasma generating system 37. The provision of remote plasma and in situ plasma allows optimization of various processes using one or both of the plasma generating techniques. In addition, a heating lamp may also be provided in the chamber 30.

An exhaust flow line 38 is provided to exhaust the gases from the chamber 30. A vacuum pump 40 is typically provided in the exhaust flow line 38 to control the gas flow and pressure in the chamber 30. Alternatively, other valves or flow control or pressure control devices may be used. Details of plasma generation employing microwave energy is known in the art and will not be described.

B. Megasonic Energy Assisted Densified Fluid Cleaning System

Figure 3:
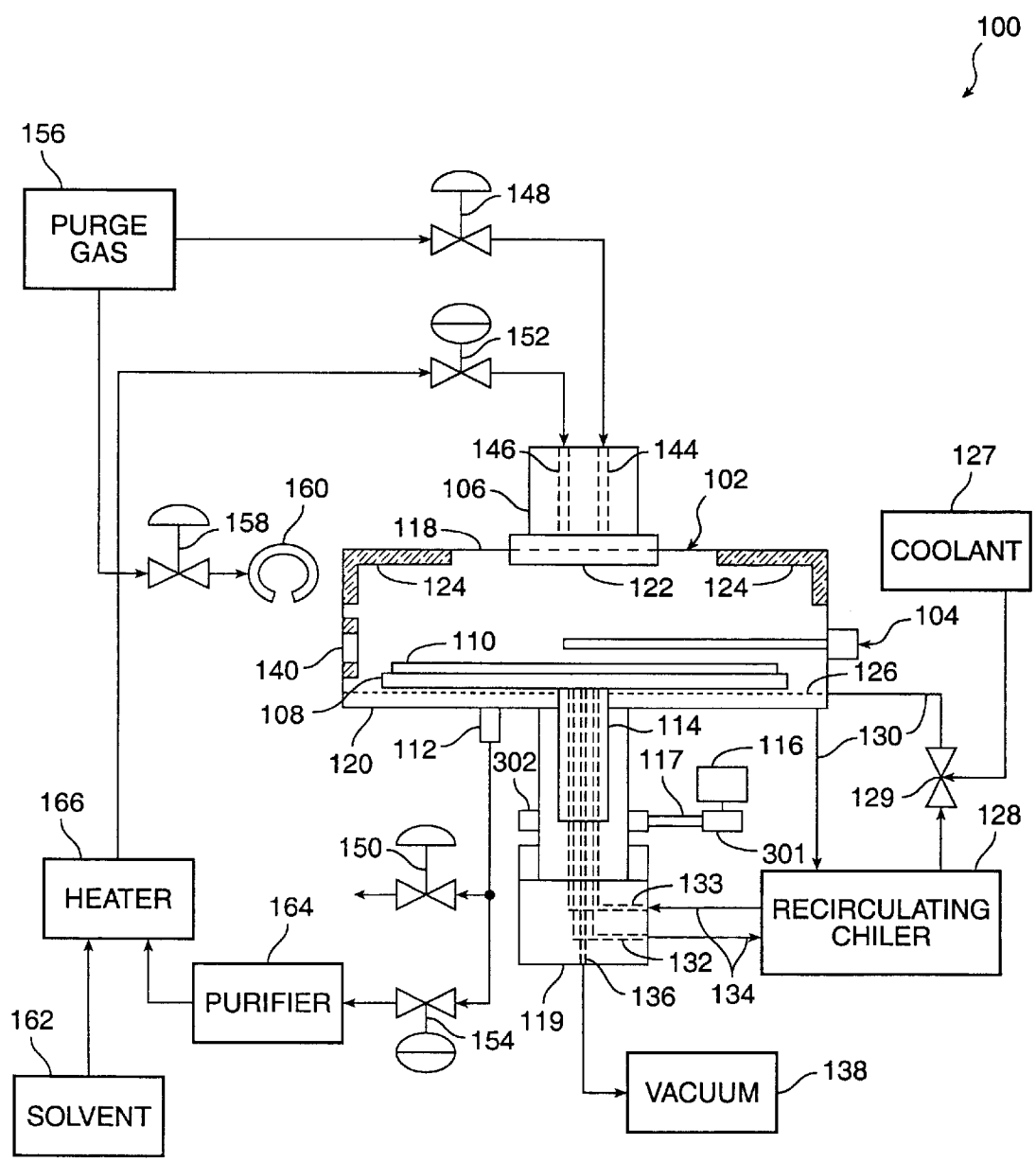
FIG. 3 is a schematic diagram of a system for densified fluid cleaning in accordance with an embodiment of the present invention.

FIG. 3 shows an exemplary embodiment of a megasonic energy assisted densified fluid cleaning system 100 for carrying the DFC process with introduction of megasonic energy for enhanced cleaning. The system 100 includes a DFC chamber 102 and a megasonic apparatus 104 which is integrated with the DFC chamber 102. The DFC chamber 102 has an entry port 106 for receiving gases. The entry port 106 is disposed above a platen 108 for supporting a substrate 110 inside the chamber 102. An exit port 112 is provided below the platen 108 for exhausting gases. The platen 108 is supported on a rotatable shaft or spindle 114 which includes a pulley 302, and is driven by a servo-controlled motor 116 transmitted through a drive pulley 301 and a drive belt 117. It is understood that other driving mechanisms may be used.

The DFC chamber 102 is preferably formed of an upper chamber portion 118 and a lower chamber portion 120. The interior of the DFC chamber 102 can have a variety of shapes. It is desirable to minimize the volume of the chamber interior for efficient use of the gases, equipment, and space. In a specific embodiment, the interior of the chamber 102 is substantially circular cylindrical with a height of about 6 inches and a diameter of about 9 inches. The DFC chamber 102 is typically made of 316 stainless steel, but it can be made of other clean, inert materials. The upper chamber portion 118 includes a showerhead 122 at the entry port 106 to increase uniformity of gas distribution over the substrate 110. Heaters 124 are provided for heating the walls of the upper chamber portion 118. The heaters 124 are typically electrical heaters.

The platen spindle 114 extends through the bottom of the lower chamber 120 to support the platen 108. The lower chamber portion 120 includes coolant channels 126 which are machined into the body for circulating a coolant from a coolant source 127. The coolant channels 126 are schematically shown in FIG. 3. A recirculating chiller 128 receives coolant from the coolant source 127 through a valve 129, and chills it typically to less than about 20° C. The coolant is typically a water-glycol mixture. The coolant is recirculated via recirculation lines 130 to the cooling channels 126 of the lower chamber portion 120. The recirculating chiller 128 also provides coolant flow to the platen 108 through a coolant inlet channel 132 and a coolant outlet channel 133 provided through the spindle 114 via recirculation lines 134, which are schematically shown in FIG. 3. The spindle 114 further includes a vacuum channel 136 coupled to a vacuum source 138 for pulling a vacuum on the substrate 110 against the platen 108. A rotary union coupling 119 is provided to communicate coolant via the spindle 114 to the platen 108 to cool the substrate 110 and to communicate vacuum to the platen 108 to locate the substrate 110 while the platen 108 is rotated. The DFC chamber 102 includes a chamber door 140 which can be opened and closed. The door 140 is typically made of 316 stainless steel, and is capable of withstanding high chamber pressure (e.g., up to about 1000 psi) while being maintained at a high temperature (e.g., up to about 100° C.).

The entry port 106 of the DFC chamber 102 has a purge inlet 144 and a solvent inlet 146. The solvent inlet 146 is provided for receiving a solvent which is typically ammonia, while the purge inlet 144 is provided for receiving a purge gas such as nitrogen. The entry of the purge gas is controlled by a purge inlet valve 148 and the exit of the purge gas is controlled by a purge outlet valve 150. The entry of the solvent is controlled by a solvent inlet valve 152 and the exit of the solvent is controlled by a solvent outlet valve 154. Typically, when the solvent inlet valve 152 and outlet valve 154 are opened for cleaning the substrate 110, the purge inlet valve 148 and outlet valve 150 are closed. Conversely, when the purge inlet valve 148 and outlet valve 150 are opened for purging the chamber 102, the solvent inlet valve 152 and outlet valve 154 are closed. The purge inlet valve 148 and outlet valve 150 are typically on-off valves, while the solvent inlet valve 152 and outlet valve 154 are typically flow control valves that are adjustable to control the entry and exit flow rates of the solvent.

A purge gas source 156 is provided for supplying a purge gas to the purge inlet valve 148. The purge gas is taken to a scrubbed exhaust after it passes through the chamber 102 and exits the purge exit valve 150. The purge gas source 156 also supplies the purge gas to a curtain valve 158 which controls the flow of the purge gas to a purge curtain 160 disposed outside the chamber door 140. The curtain valve 158 may be adjustable. The purge curtain 160 prevents or at least minimizes the diffusion of the solvent out of the chamber 102 when the door 140 is opened during transfer of the substrate 110 into or out of the chamber 102. When the cleaned substrate 110 is taken out of the chamber 102, the purge curtain 160 is turned on not only to prevent diffusion of the solvent out of the chamber 102, but to remove any residual solvent on the substrate 110. The purge gas is typically heated for more effective removal of the residual solvent by evaporation.

A solvent source 162 is provided to supply a solvent such as ammonia typically in the gas phase. The ammonia is preferably a ultra-high purity semiconductor grade ammonia. A purifier 164 is desirably provided for purifying recirculated solvent. The solvent from the solvent source 162 in the embodiment shown is sufficiently pure and does not need to be purified. In an alternative embodiment, the solvent from the solvent 162 is coupled to the purifier 164 for purification before entering the chamber 102. The solvent is then heated by a heater 166 before entering the solvent inlet valve 152. The DFC system 100 advantageously recycles the solvent from the DFC chamber 102 to reduce the environmental impact and save cost. This is accomplished by flowing the solvent from the chamber 102 through the solvent exit valve 154 to the purifier 164 for purifying the recycled solvent to a purity level that is suitable for reuse. The solvent intake from the source 162 is reduced as a result of the recirculation through the purifier 164, and is controlled relative to the recirculation flow to maintain a desired pressure of injection into the DFC chamber 102.

The heater 166 can use a variety of known heating methods for heating the solvent to a desired temperature for carrying out the DFC process in the chamber 102. Certain methods including mechanical ways of heating the solvent such as compression can introduce contaminants into the solvent. The present invention preferably employs a method that prevents or minimizes contamination of the solvent. According to a specific embodiment, the DFC system 100 employs a heat pump as the heater 166 which performs a condensation step for liquefying the solvent followed by a boiling step for producing a gas phase solvent at a high temperature. The condensation-boiling process is similar to distillation, and is an effective method of producing the gas phase solvent at the desired temperature without introducing contaminants.

Figure 3A:
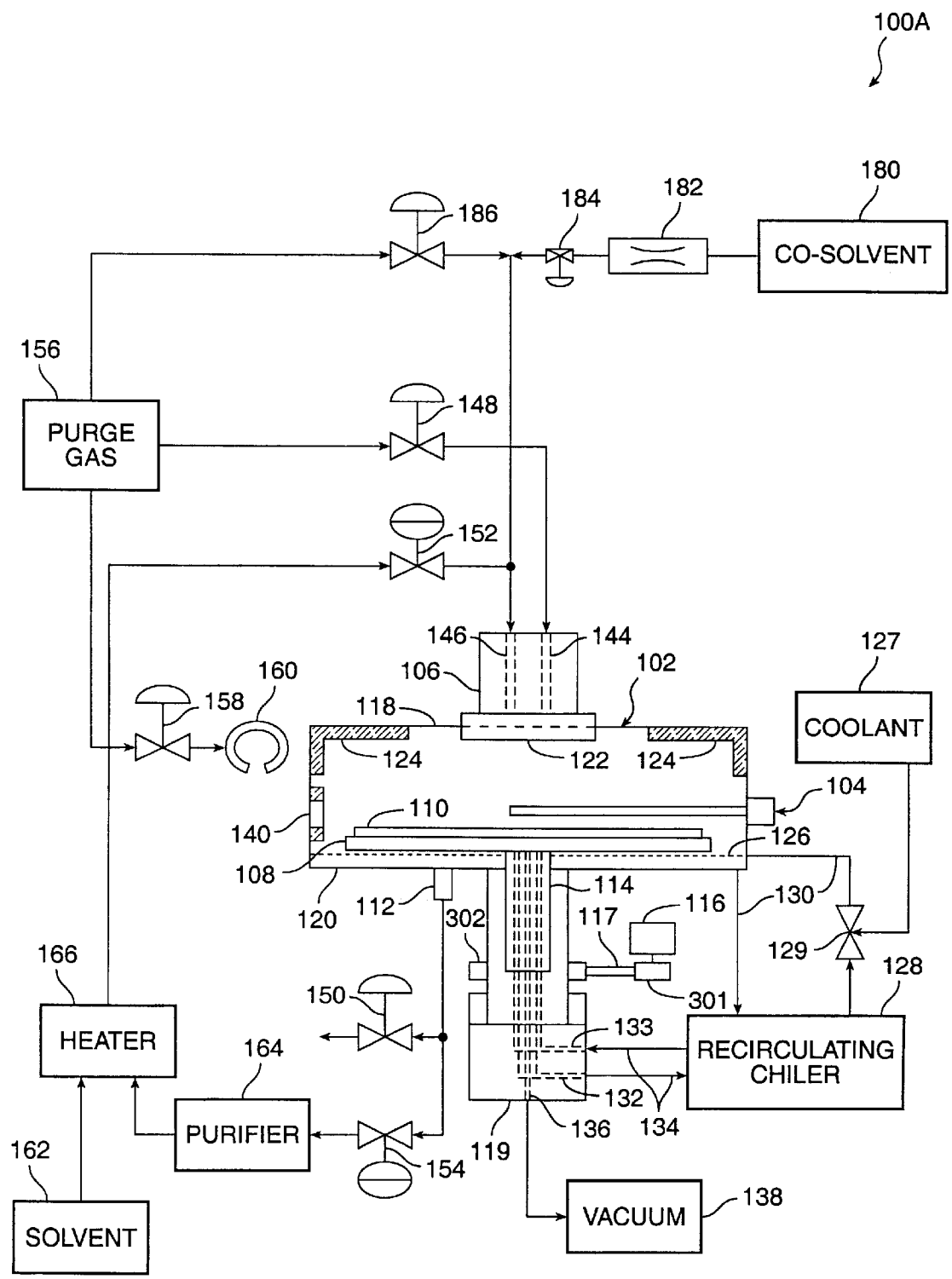

FIG. 3A shows an alternative embodiment of the densified fluid cleaning system 100A which includes a co-solvent source 180 for introducing a co-solvent into the DFC chamber 102 with the solvent when desired. The co-solvent in the co-solvent source 180 is typically a stable vapor at a suitable pressure which is added in vapor form to the solvent. The co-solvent vapor is metered into the solvent flow during pressurization or after stable process pressure has been achieved in the DFC chamber 100. The co-solvent metering occurs through a metering device 182 which may be a mass flow controller (MFC) or the like. An isolation valve 184 is coupled downstream of the metering device 182. The isolation valve 184 is opened to allow flow of the co-solvent into the DFC chamber 102 when desired. Mixing of the solvent from the solvent inlet flow control valve 152 and the co-solvent occurs near the solvent inlet 146 of the entry port 106 and before the showerhead 122.

Purge gas from the purge gas source 156 flows into the co-solvent supply line via another purge gas valve 186. During the DFC process, the purge gas valve 186 is closed. After completion of the DFC process, the purge gas valve 186 is opened to flow the purge gas such as nitrogen to purge the co-solvent line as well as the chamber. The valves 184, 186 are typically on-off valves.

Figure 3B:
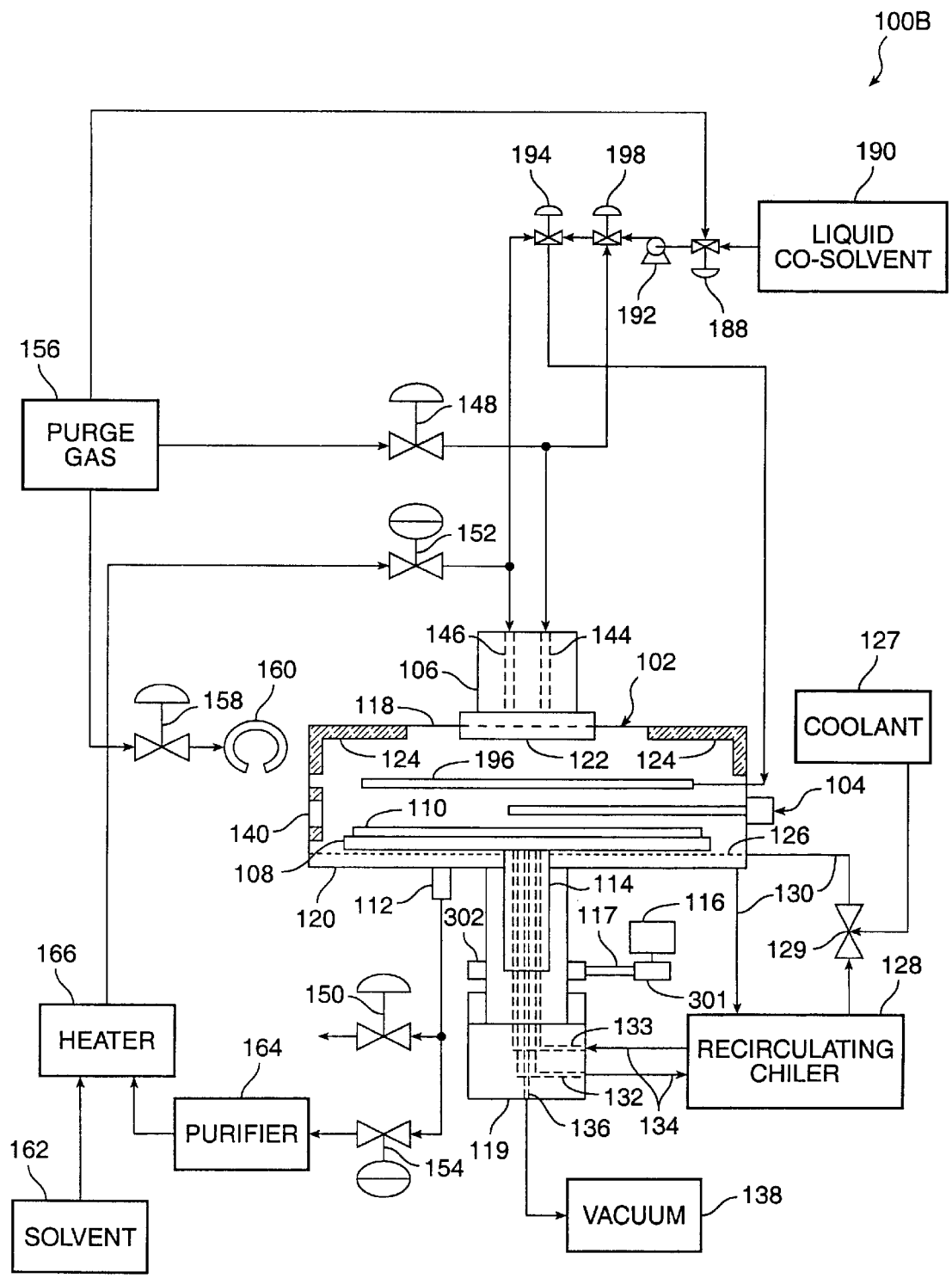

FIG. 3B shows another embodiment of the densified fluid cleaning system 100B which is used for introducing a co-solvent available in liquid form from a source 190 into the DFC chamber 102 when desired. A purge-isolation valve 188 is coupled downstream of the liquid co-solvent source 190 as well as the purge gas source 156. The purge-isolation valve 188 is a three-way valve with a common outlet connected with a co-solvent pump 192, which is capable of metering the co-solvent at the desired flow rate and generating pressure sufficient to displace the co-solvent into the DFC chamber 102 for processing. The purge-isolation valve 188 is provided to allow the co-solvent line to be purged with the purge gas when the co-solvent source 190 is being replaced or replenished.

The outlet of the co-solvent pump 192 is coupled to a second purge-isolation valve 198 and a third purge-isolation valve 194, which are also three-way valves. During DFC processing, the valves 198, 194 direct the co-solvent from the pump 192 to an injector 196 which desirably distributes the co-solvent substantially uniformly over the entire surface of the substrate 110. The injector 196 may include perforated pipe distributors, nozzles, or the like. The injector 196 is positioned sufficiently high above the substrate 110 to avoid interfering with the lifting of the substrate 110 for transfer into and out of the chamber 102.

The third purge-isolation valve 194 is provided to flush out the last remnants of the co-solvent after a desired amount has been metered. The gas which is used to flush out the co-solvent is the solvent from the solvent inlet valve 152 which is coupled with the third purge-isolation valve 194.

The solvent flushes the co-solvent injection line of all liquid co-solvent out of the injector 196.

After completion of the DFC processing, the purge gas is used to purge the gas lines and the chamber 102. The purge gas flows through the second purge-isolation valve 198 when the purge gas inlet valve 148 is opened to purge the co-solvent line simultaneously with purging of the DFC chamber 102.

1. Megasonic Energy Apparatus

Figure 4:
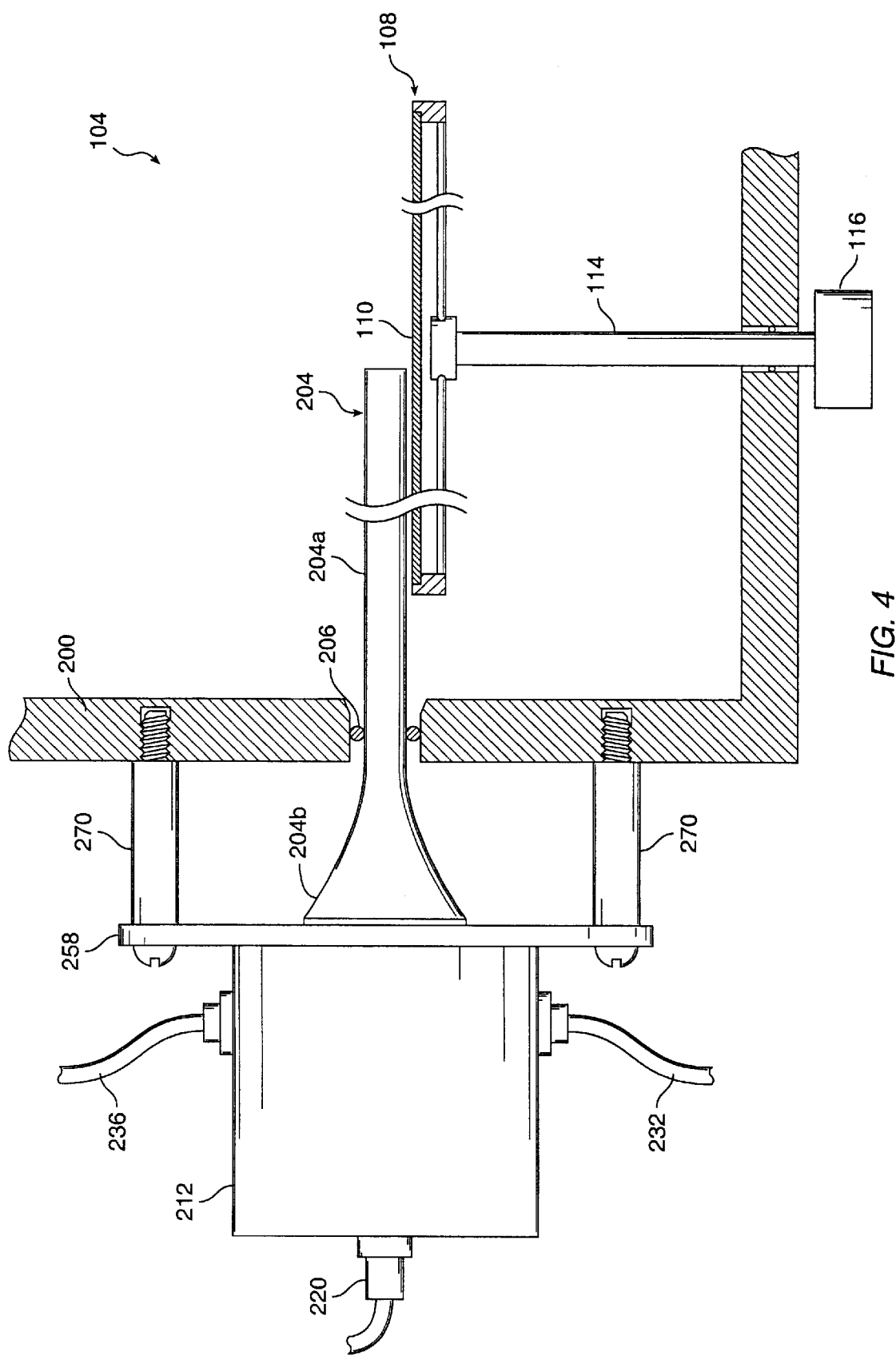
FIG. 4 is a partial cross-sectional view of a megasonic apparatus in the densified fluid cleaning system of FIG. 3 in accordance with an embodiment of the invention.
Figure 5:
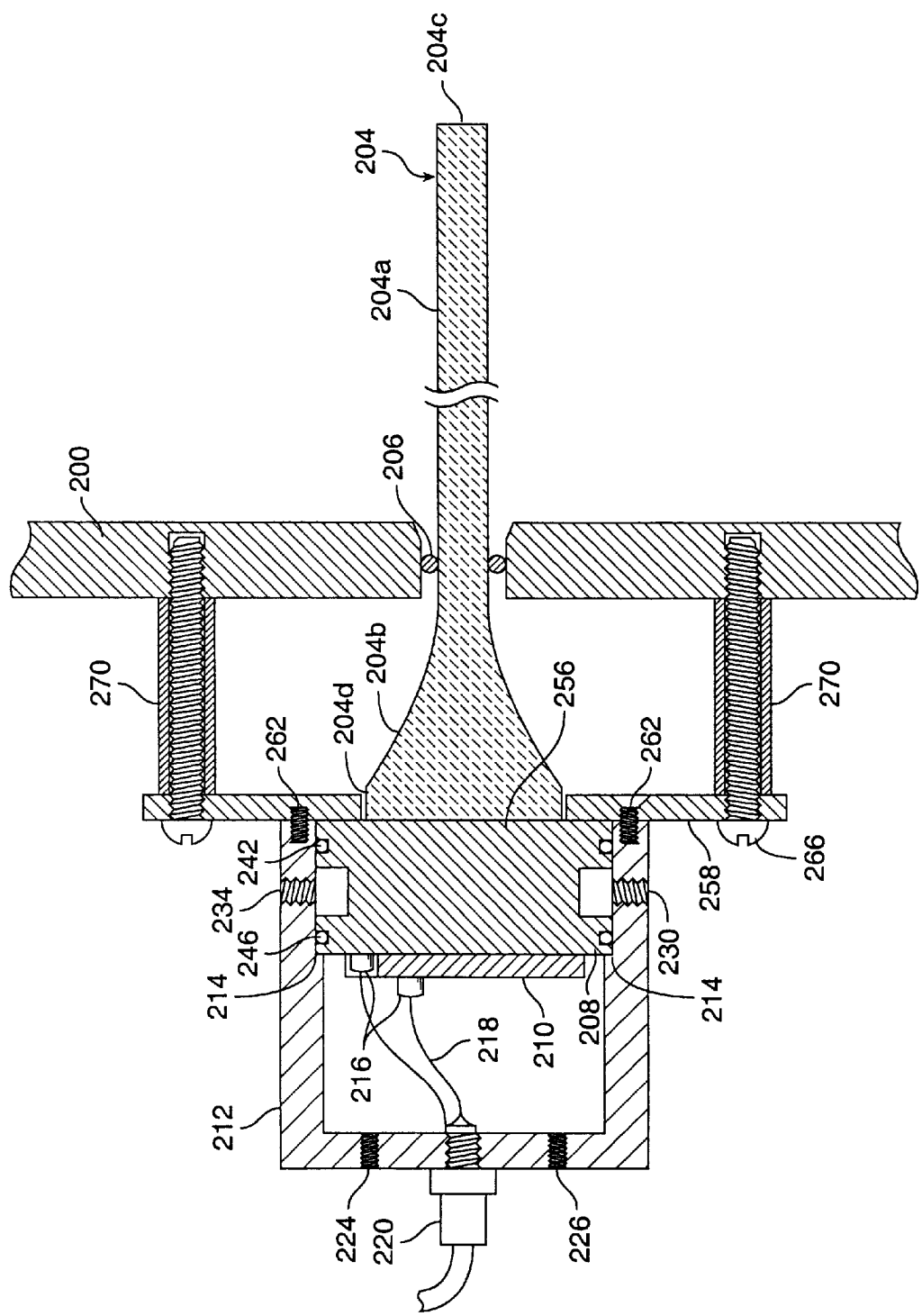
FIG. 5 is a cross-sectional view of the megasonic apparatus of FIG. 4.
Figure 6:
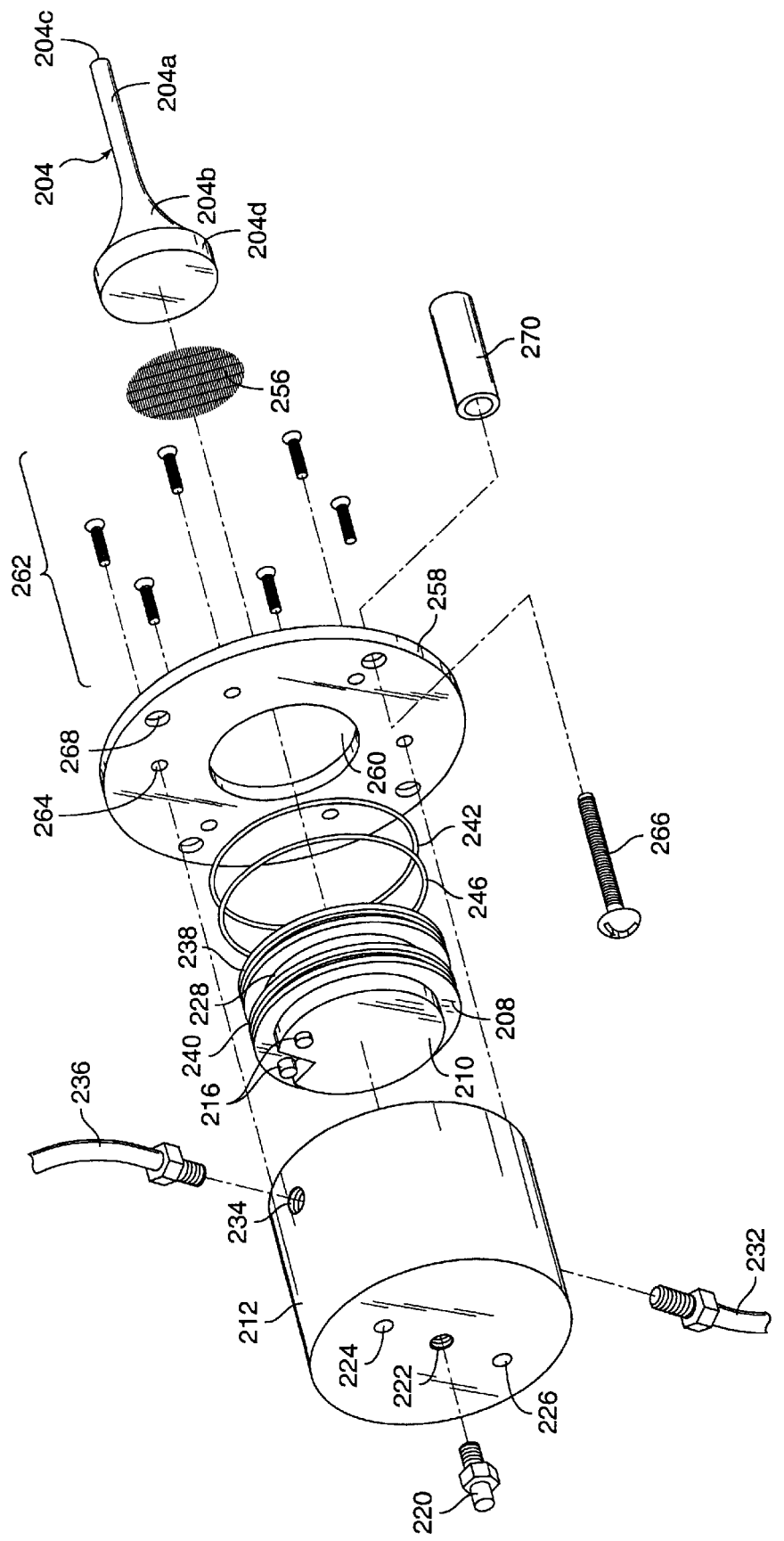
FIG. 6 is an exploded perspective view of the megasonic apparatus of FIG. 4.

FIGS. 4–6 show an exemplary embodiment of the megasonic energy apparatus 104 which is integrated with the DFC chamber 102 and coupled to a wall 200 of the chamber 102 to introduce megasonic energy into the layer of densified solvent to assist the cleaning process. The apparatus 104 is available from VERTEQ, INC., and an embodiment of the apparatus 104 is described in PCT publication WO 98/14985, which is incorporated herein by reference in its entirety.

The apparatus 104 includes a megasonic probe 204 which is supported by the wall 200 of the DFC chamber 102 through an opening which is preferably sealed, for example, by an O-ring 206. As shown in FIGS. 5 and 6, the probe 204 is acoustically and mechanically coupled to a heat transfer member 208, which in turn is acoustically coupled to a piezoelectric transducer 210. The heat transfer member 208 and piezoelectric transducer 210 are disposed in a housing 212. The heat transfer member 208 is captured within an annular recess 214 in an inner surface of the housing 212. The piezoelectric transducer 210 includes contacts 216 that are connected via wiring 218 to an electrical contact 220, which is threadingly coupled to a threaded opening 222 of the housing 212, and is coupled to a source of radio-frequency excitation (not shown). A pair of openings 224, 226 allow a purge gas to enter and exit the housing 212 when needed.

The heat transfer member 208 has a generally cylindrical shape with an annular coolant groove 228. The housing 212 includes a threaded opening 230 for receiving an inlet conduit 232 and a threaded opening 234 for receiving an outlet conduit 236 for passing coolant through the housing 212 into the coolant groove 228 of the heat transfer member 208. The coolant may be provided by the coolant source 127 and chiller 128 (see FIG. 3), or by a separate coolant source. A pair of smaller annular grooves 238, 240 on both sides of the coolant groove 228 are fitted with suitable seals, such as O-rings 242, 246, to contain the coolant and isolate it from the other portions of the apparatus. The heat transfer member 208 is made of a material that is a good conductor of heat and megasonic energy. In one embodiment, the heat transfer member 208 and the housing 212 are made of aluminum.

The probe 204 has an elongated cleaning portion 204a and a sloped portion 204b, as shown in FIGS. 4–6. The probe 204 is typically round in cross-section. The cleaning portion 204a preferably is at least substantially constant in cross-section and terminates at a probe tip 204c. The sloped portion 204b increases in cross-section gradually from the cleaning portion 204a to a rear portion 204d, which is coupled to the heat transfer member 208. The large surface at the end of the rear portion 204d is advantageous for transmitting a large amount of megasonic energy which is concentrated in the smaller cleaning portion 204a. The probe 204 is typically a solid member made of a relatively inert, non-contaminating material which efficiently transmits acoustic energy. Quartz is preferred. Other materials that may be used include sapphire, silicon carbide, and boron nitride.

The cross-section of the cleaning portion 204a should be sufficiently large to withstand mechanical vibration produced by the megasonic energy. The length of the cleaning portion 204a should be sufficiently long to transmit the megasonic energy to the entire surface of the substrate. For a rotating substrate, the cleaning portion 204a desirably reaches approximately the center of rotation of the substrate 110. In one embodiment, the length of the cleaning portion 204a is about 8.25 inch, the diameter of the cleaning portion 204a is about 10 mm, and the diameter of the rear portion 204d is about 2.5 inch.

In the embodiment shown in FIGS. 5 and 6, the end face at the rear portion 204d of the probe 204 is bonded or glued to the heat transfer member 208. A thin metal screen 256 is preferably disposed between the end face of the rear portion 204d and the heat transfer member 208 to facilitate transmission of the acoustic energy to the probe 204. Other ways of coupling the rear portion 204d and the heat transfer member 208 are possible so long as the megasonic energy is adequately transmitted. The transducer 210 is also bonded or glued to the heat transfer member 208 in the embodiment shown. The transducer 210 has the shape of a disc with a diameter that is approximately the same or larger than the diameter of the rear portion 204d of the probe 204 for efficient transmission of the megasonic energy to the probe 204. The heat transfer member 208 is preferably gold-plated to prevent oxidizing of the aluminum to ensure adequate bonding with the probe 204 and the transducer 210.

As best seen FIGS. 5 and 6, the housing 212 is coupled to an annular plate 258 which has an opening 260 through which the probe 204 extends to couple with the heat transfer member 208. The annular plate 258 is coupled to the housing 212 by a plurality of fasteners 262 extending through a plurality of apertures 264 of the plate 258. The annular plate 258 is attached to the-wall 200 of the DFC chamber 102. In the embodiment shown, a plurality of fasteners 266 are provided to attach the annular plate 258 to the wall 200 via a plurality of holes 268 which are arranged in the peripheral portion of the plate 258 that extends beyond the housing 212. The fasteners 266 desirably extend through a plurality of sleeves or spacers 270 which space the annular plate 258 from the wall 200. The spacers 270 advantageously position the probe 204 such that only the cleaning portion 204a extends into the DFC chamber 102. The spacers 270 also reduce the transfer of the vibration of the annular plate 258, the heat transfer member 208, and the housing 212 to the DFC chamber 102.

2. Densified Fluid Cleaning Apparatus

Figure 7:
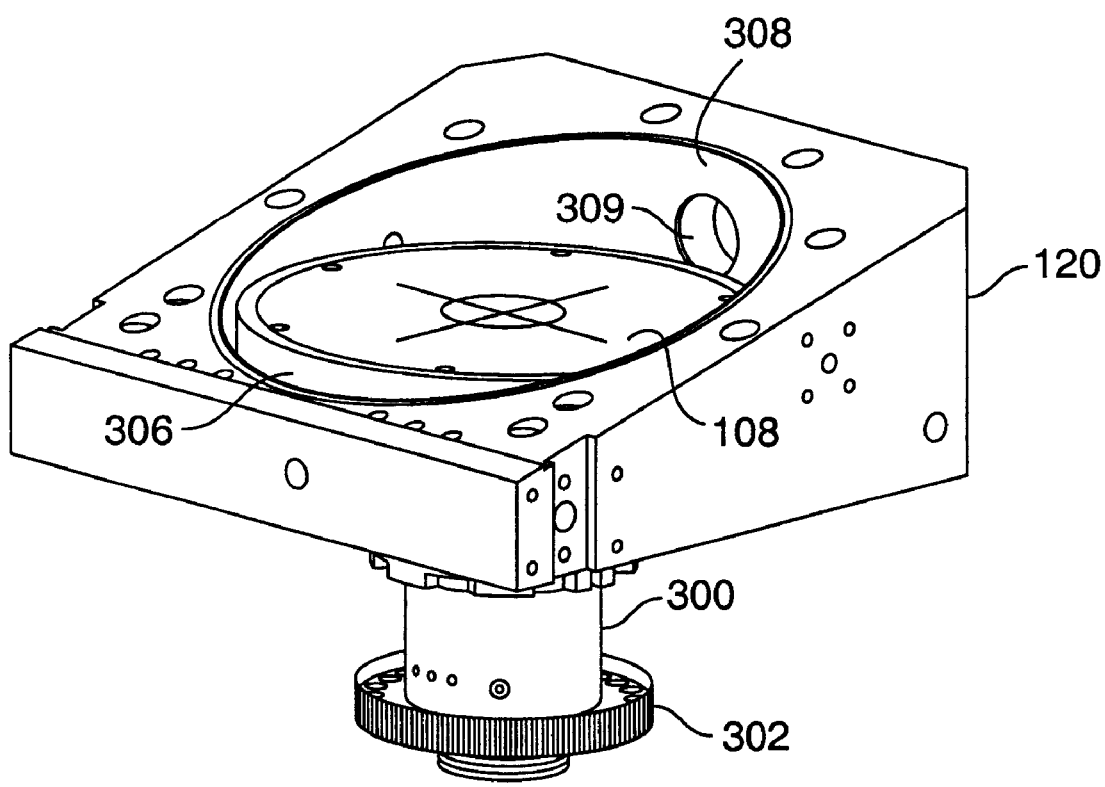
FIG. 7 is a perspective of a lower chamber portion and a platen spindle assembly in the densified fluid cleaning system of FIG. 3.

FIG. 7 shows the lower chamber portion 120 having the platen 108 disposed therein. The platen 108 is coupled to the platen spindle 114 (see FIG. 3) which is housed in a platen spindle assembly 300. The platen spindle assembly 300 includes a pulley 302 which is driven by the motor 116 (FIG. 3) to rotate the spindle 114 in the assembly 300 and the platen 108. The platen spindle assembly 300 further includes various seals, bearings, and bushings (not shown) to seal the interior of the DFC chamber 102 and to transmit the rotational motion from the pulley 302 to the spindle 114 and the platen 108.

A cold ring 306 is provided between the periphery of the platen 108 and the wall 308 of the lower chamber portion 120. As discussed above, both the platen 108 and the lower chamber portion 120 are preferably cooled by coolant flows. The cold ring 306 is cooled by contact with the lower chamber portion 120 ensuring that used solvent flowing off the substrate 110 and platen 108 does not re-evaporate and re-deposit contamination removed by the solvent on the substrate 110. A probe opening 309 is provided through the wall 308 to receive the megasonic probe 204.

Figure 8:
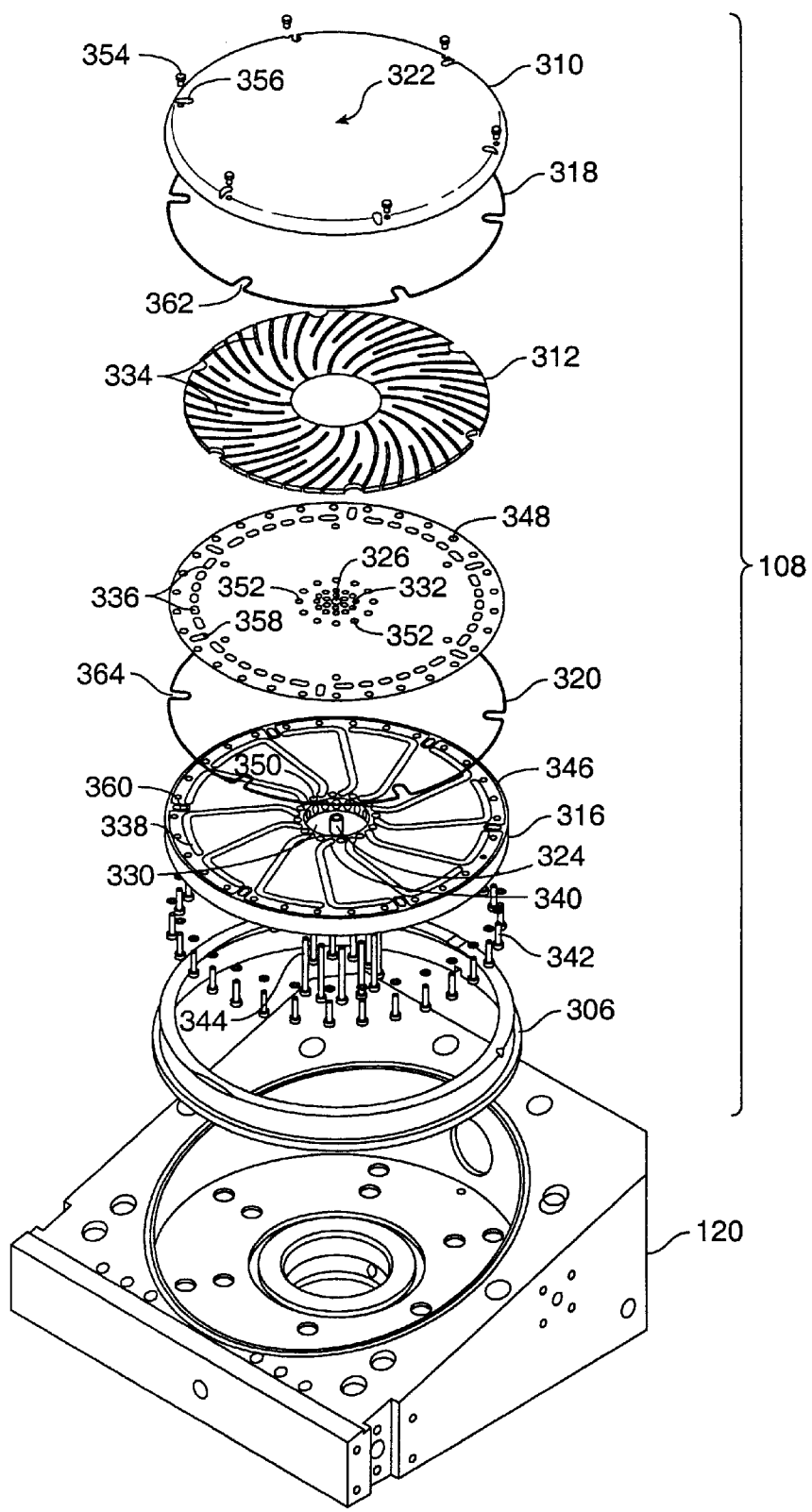
FIG. 8 is an exploded perspective view of a platen assembly in the densified fluid cleaning system of FIG. 3.

FIG. 8 shows the assembly of the platen 108, which includes a platen top 310, a platen insert 312, a flow distribution plate 314, and a platen flow collector 316. A first molded seal 318 is disposed between the platen top 310 and the platen insert 312, and a second molded seal 320 is disposed between the flow distribution plate 314 and the platen flow collector 316, to provide sealing between the respective components.

The platen top 310 has a central opening 322, the platen flow connector 316 includes a central opening 324, and the flow distribution plate 314 includes a central opening 326. The platen insert 312 is an annular member disposed between the platen top 310 and the flow distribution plate 314. The central openings 322, 324, 326 provide a channel for communicating with the vacuum channel 136 through the spindle 114 which is coupled to the vacuum source 138 for pulling a vacuum on the substrate 110 against the top 310 of the platen 108 (see FIG. 3).

As shown in FIG. 8, the platen flow collector 316 includes an annular opening 330 for receiving coolant from the coolant inlet channel 132 of the spindle 114 (see FIG. 3). The flow distribution plate 314 has a plurality of apertures 332 disposed above the annular opening 330 for receiving the coolant and distributing it outwardly via a plurality of flow paths machined on the underside of the platen top 310. The plurality of flow paths allow the coolant to contact a substantial portion of the platen top 310 for improved uniform cooling. The flow paths are desirably configured in a spiral manner for the outward flow of the coolant in the rotating platen 108 to ensure low flow pressure drop.

The platen 312 has flow paths 334 in a spiral pattern that fits into the spiral flow paths machined on the underside of the platen top 310. The platen insert is tapered in thickness from center to edge thereby occupying a larger portion of the flow paths machines on the underside of the platen top 310 near the edge. This ensures more uniform velocity of coolant across the platen and permits more uniform heat removal.

The coolant flows from the flow paths 334 of the platen insert 312 down through a plurality of outer apertures 336 of the flow distribution plate 314 to collection channels 338 of the platen flow collector 316. The coolant flows inwardly along the collection channels 338 to an outer annular opening 340 which is coupled with the coolant outlet channel 133 in the spindle 114. The coolant flows from the coolant outlet channel 133 to the recirculation line 134 and the recirculating chiller 128 (see FIG. 3). The collection channels 338 of the platen flow collector 316 are advantageously configured to spiral in an opposite direction from the flow paths 334 of the platen insert to ensure low flow pressure drop in the inward flow of the coolant during rotation of the platen 108.

The components of the platen assembly 108 are connected together using outer fasteners 342 and inner fasteners 344. In the embodiment shown in FIG. 8, the outer fasteners 342 include a plurality of bolts which extend through outer openings 346 of the platen flow collector 316 and outer openings 348 of the flow distribution plate 314, and which are connected with threaded holes drilled on the underside of the platen top 310. The inner fasteners 344 include a plurality of threaded bolts which extend through inner openings 350 of the platen flow collector 316 and inner openings 352 of the flow distribution plate 314 and connect with the platen top 310. The outer fasteners 342 and inner fasteners 344 connect the platen top 310, the first molded seal 318, the flow distribution plate 314, second molded seal 320, and platen flow collector 316 together.

Substrate locators 354 have precisely dimensioned heads and are threaded onto the top surface of the platen top 310. The substrate locators 354 prevent eccentric placement of the substrate 110, thereby avoiding damage to the substrate 110 during platen rotation. To accommodate lifting pins for lifting the substrate 110 for transfer in and out of the DFC chamber 102 as discussed below, the platen top 310 includes holes 356, the flow distribution plate 314 includes holes 358, the platen flow collector 316 includes holes 360, the first molded seal 318 includes notches 362, and the second molded seal 320 includes notches 364. The platen top 310, platen insert 312, flow distribution plate 314, platen flow collector 316, outer fasteners 342, inner fasteners 344, and upper fasteners 354 are typically made of metal such as 316 stainless steel. Some parts such as the platen top 310 and platen flow collector 316 are desirably electropolished and passivated. The seals 318, 320 and sealing channel portion 328 are typically made of EPDM.

Figure 9:
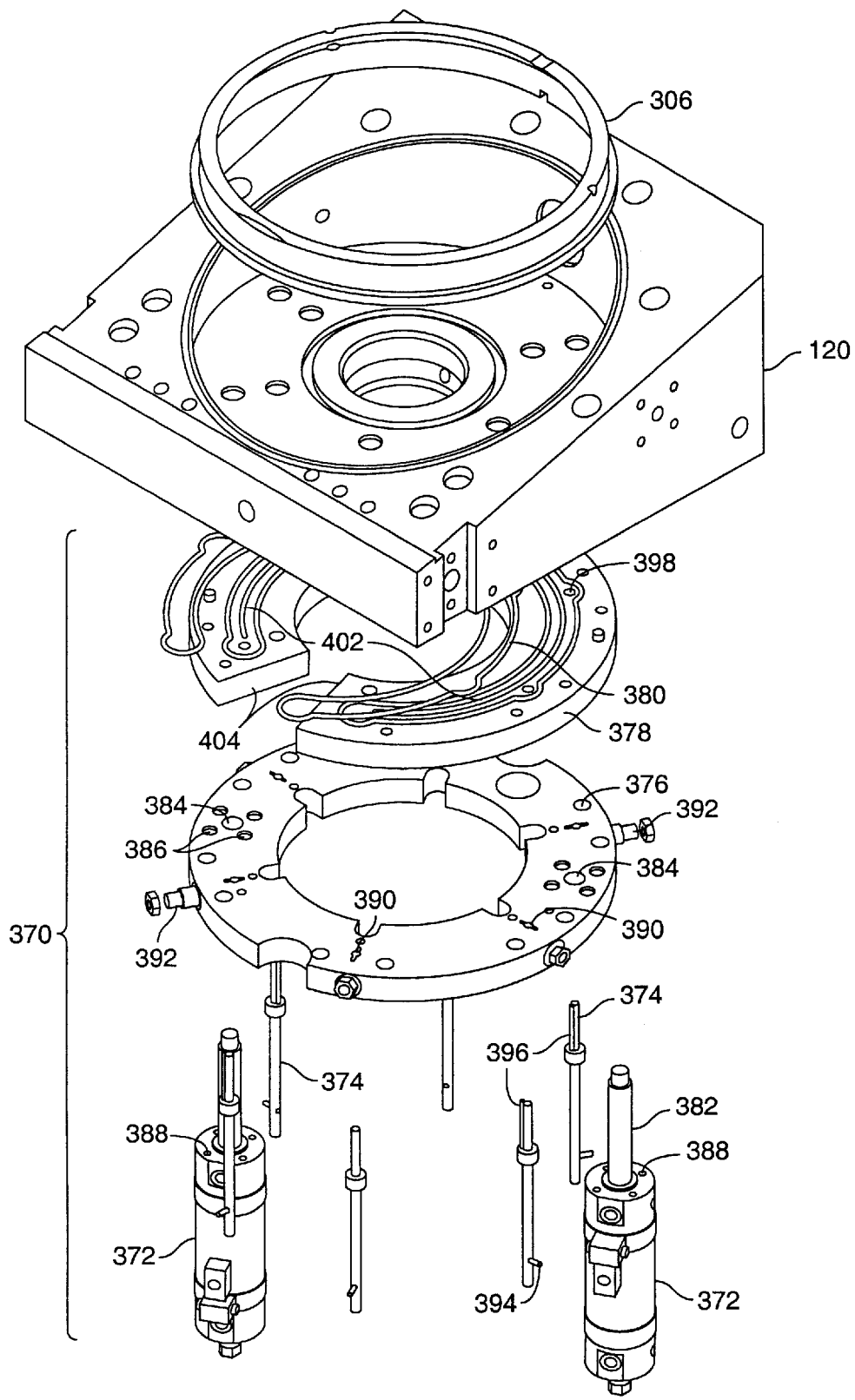
FIG. 9 is an exploded perspective view of a wafer lifting mechanism in the densified fluid cleaning system of FIG. 3.
Figure 10:
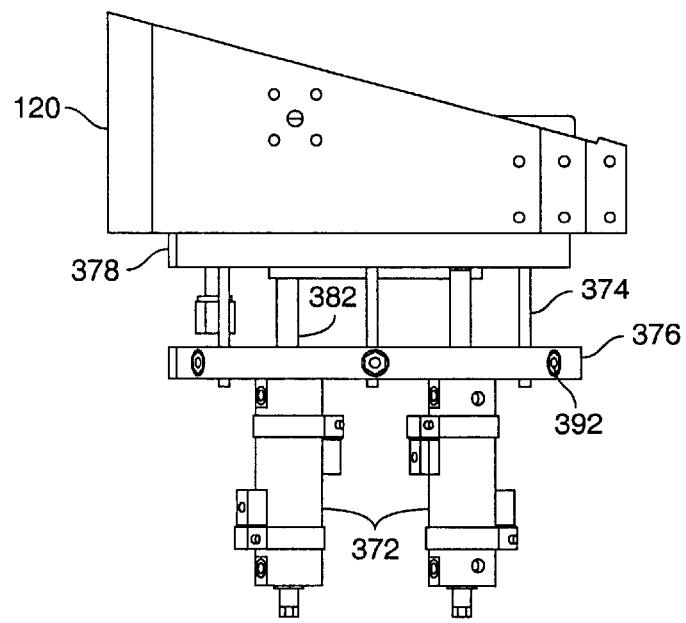
FIG. 10 is an elevational view of the wafer lifting mechanism of FIG. 9.

FIGS. 9 and 10 show a wafer lifting mechanism 370 for lifting the substrate 110 for transfer in and out of the DFC chamber 102. The lifting mechanism 370 includes a pair of pin actuators 372, a plurality of lift pins 374, a pin ring 376, a collector ring 378 disposed below the bottom of the lower chamber portion 120, and a molded seal 380 disposed between the collector ring 378 and the bottom of the lower chamber portion 120. The pin actuators 372 have actuator arms 382 that extend through actuator apertures 384 of the pin ring 376 and connect with the collector ring 378. The collector ring 378 is coupled to the bottom of the lower chamber portion 120 using, for example, fasteners (not shown). The pin actuators 372 are mounted to the pin ring 376 using fasteners such as screws (not shown) extending through mounting holes 386 in the pin ring 376 into openings 388 in the actuators 372. The pin ring 376 includes a plurality of pin apertures 390 for receiving the lift pins 374, and a plurality of pin mounting screws 392 for engaging protrusions 394 provided on the lift pins 374 to mount the lift pins 374 in the pin ring 376. The top portions 396 of the lift pins 374 extend through apertures 398 in the collector ring 378 through apertures 400a or 400b of the lower chamber portion 120. The top portions 396 of the lift pins 374 further extend through the holes 360 of the platen flow collector 316, the notches 364 of the second molded seal 320, the holes 358 of the flow distribution plate 314, the notches 362 of the first molded seal 318, and the holes 356 of the platen top 310 (see FIG. 8) to contact the bottom of the substrate 110. Outer apertures 400a are provided for a large substrate having a large diameter (e.g., 200 mm) while inner apertures 400b are used for a small substrate having a small diameter (e.g., 150 mm). As configured, the same chamber 102 can be used for different substrate sizes, and only the lifting mechanism 370 and platen 108 need to be replaced.

Because only one of the two sets of apertures 400a and 400b are used to accommodate movement of the top portions 396 of the lift pins 374 (e.g., 400a), the other set of apertures (e.g., 400b) are used as exhaust apertures for exhausting gases in the chamber 102. The exhaust apertures 400b are aligned with a collection channel 402 in the collector ring 378 which guides the exhaust gas from the exhaust apertures 400b to the exit port 112 of the chamber 102 (see FIG. 3).

As seen in FIG. 9, the pin ring 376 and collector ring 378 are annular members to accommodate the spindle 114 through the center. In the embodiment shown in FIG. 9, the collector ring 378 is not a complete ring but includes edge surfaces 404. The seal 380 is used to seal the collection channel 402 and the apertures 398 for the lift pins 374. In an alternative embodiment (not shown), the collector ring 378 and the seal 380 are complete ring members. The pin ring 376 is typically made of 6061-T6 aluminum, while the collector ring 378 is typically made of 316 stainless steel and is electropolished and passivated. The seal 380 is typically made of EPDM.

As shown in the assembled view of FIG. 10, the actuator arms 382 of the pin actuators 372 are connected with the collector ring 378 which is coupled to the bottom of the lower chamber portion 120. The pin actuators 372 are configured to extend the actuator arms 382 out or draw the arms 382 into the body of the actuators 372. When the pin actuators 372 are activated to draw the arms 382 inward, the pin ring 376 is pulled up toward the lower chamber portion 120, thereby moving the lift pins 374 upward to lift the substrate 110 from the platen 108. When the pin actuators 372 are activated to extend the actuator arms 382 outward, the pin ring 376 and the lift pins 374 are pushed downward to lower the substrate 110 onto the platen 108.

Figure 11:
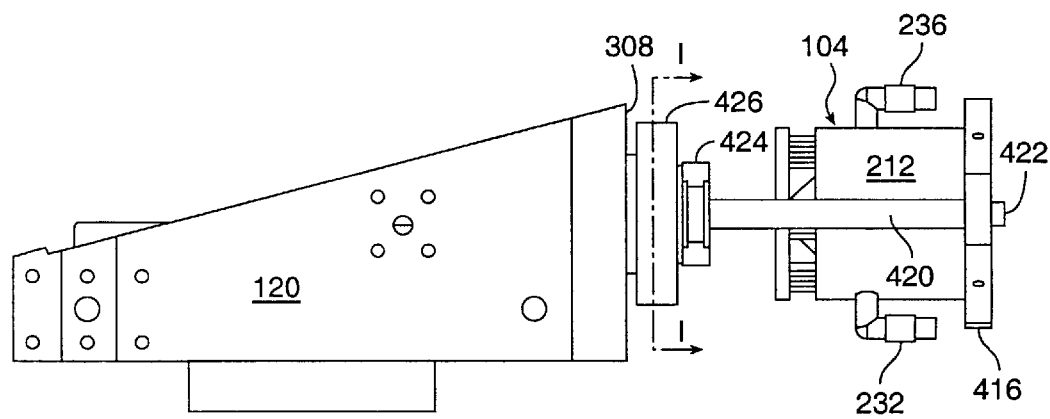
FIG. 11 is an elevational view of the megasonic apparatus in the densified fluid cleaning system of FIG. 3 illustrating the mounting of the megasonic apparatus to the chamber to provide positioning capability for the megasonic probe in accordance with another embodiment of the invention.
Figure 12:
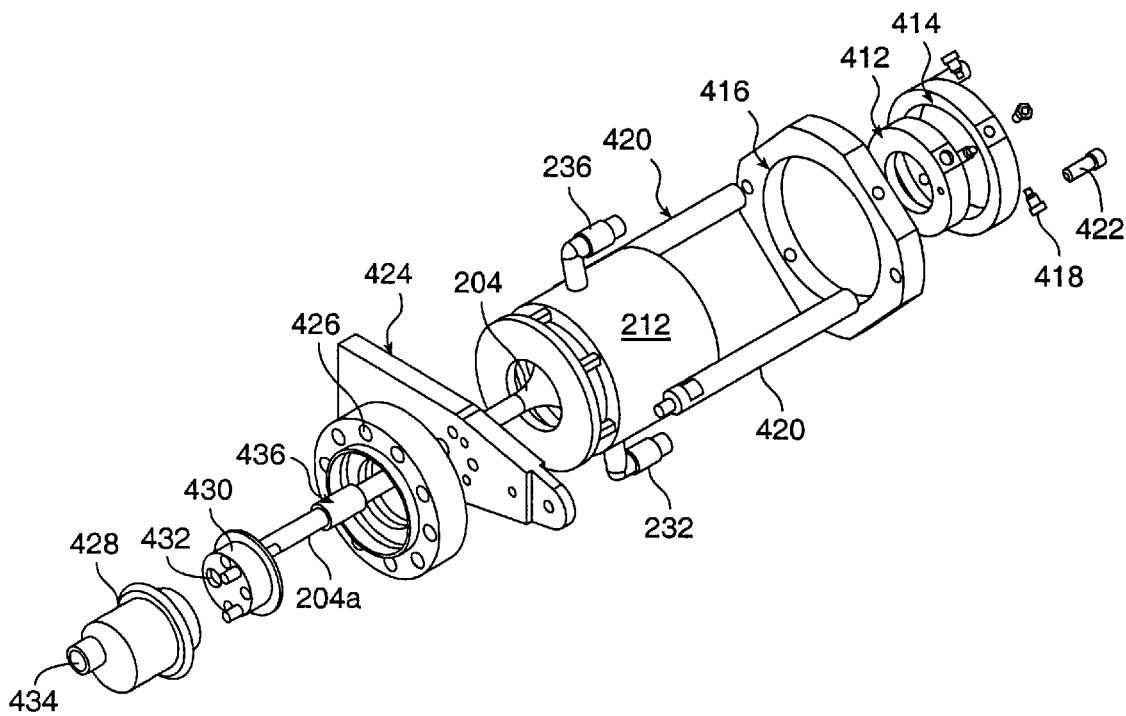
FIG. 12 is an exploded perspective view of the megasonic apparatus of FIG. 11.
Figure 13:
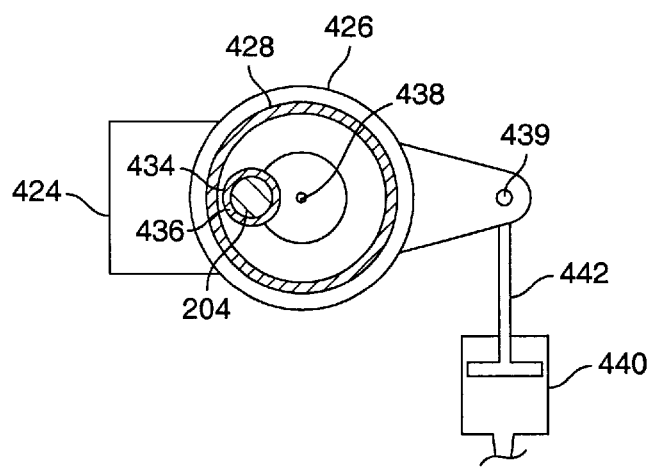
FIG. 13 is a partial cross-sectional view of the megasonic apparatus of FIG. 11 along I—I.

FIGS. 11–13 show another embodiment of the coupling of the megasonic apparatus 104 to the lower chamber portion 120 which is different from the embodiment illustrated in FIGS. 4–6. In the embodiment of FIGS. 4–6, the probe 204 is mounted to the wall 200 of the chamber 102 and fixed relative to the wall 200. In the embodiment illustrated in FIGS. 11–13, the probe 204 is not fixed to the wall 308 of the lower chamber portion 120 but is movable relative to the wall 308 to allow adjustment of the spacing between the cleaning portion 204a of the probe 204 and the surface of the substrate 110.

In this embodiment, the housing 212 of the megasonic apparatus 104 is coupled to an inner gimbal ring 412 by screws (not shown). The inner gimbal ring 412 is coupled to an intermediate gimbal ring 414 by means of swivel screws 418A. This permits the inner gimbal ring 412 to swivel in relation to the intermediate gimbal ring around an axis defined by a line drawn through the respective axes of the swivel screws 418A. A second pair of swivel screws 418B couple the intermediate gimbal ring 414 to the outer gimbal ring 416. This permits the intermediate gimbal ring 414 to swivel in relation to the outer gimbal ring 416 around an axis defined by a line drawn through the respective axes of the second pair of gimbal screws 418B. In this embodiment, the axis of rotation for the inner gimbal ring 412 is mutually perpendicular to the axis of rotation for the intermediate gimbal ring. The assembly of gimbal rings permits self-alignment for the housing 212 of the megasonic apparatus with respect to the axis of the rotation mechanism. The relatively thin probe 204 does not substantially carry the weight of the megasonic apparatus. A pair of transducer standoffs 420 are disposed along opposite sides of the housing 212 and are each connected at one end with the outer gimbal ring 416 by a fastener 422.

The other end of each transducer standoff 420 is connected with an actuator bracket 424. A mounting bracket 426 is disposed between the actuator bracket 424 and the wall 308 of the lower chamber portion 120. An eccentric bushing 428 is rotatably disposed in the mounting bracket 426 and a driver bushing 430 is provided in the actuator bracket 424. The probe 204 extends through an eccentric opening 432 of the driver bushing 430 and an eccentric opening 434 of the eccentric bushing 428. A guide bushing 436 is provided around the probe 204 to permit rotation of the probe 204 relative to the eccentric openings 432, 434. For simplicity and clarity, FIGS. 11–13 do not show the bearings and seals in the mounting bracket 426 to provide sealing of the chamber 102 and to facilitate rotational movement of the eccentric bushing 428 and probe 204 relative to the mounting bracket 426. The bushings are typically made of 316 stainless steel and the seals are typically made of EPDM. In the embodiment shown, the gimbal mechanism (412, 414, 416) advantageously supports much of the weight of the megasonic apparatus 104 through the transducer standoffs 420 so that the weight is not carried substantially by the probe 204.

The eccentric mounting of the probe 204 is best seen in FIG. 13. The eccentric opening 434 of the eccentric bushing 428 positions the guide bushing 436 and the probe 204 eccentrically from the center of rotation 438 of the eccentric bushing 428. The actuator bracket 424 is coupled at an end 439 with an actuator device 440, which is typically a linear actuator such as an air cylinder. The actuator shaft 442 of the actuator 440 moves up and down, causing the actuator bracket 424 and the driver bushing 430 to rotate, which in turn causes the eccentric bushing 428 to rotate relative to the center of rotation 438 of the eccentric bushing 428 inside the mounting bracket 426. Because the probe 204 is eccentrically disposed relative to the center of rotation 438, the probe 204 will rotate relative to the center of rotation 438. When the actuator shaft 442 moves up, the probe 204 moves down, and vice versa. Because the displacement of the probe 204 is typically small, the rotation of the probe 204 is substantially equivalent to a vertical displacement up and down relative to the surface of the substrate 110. Further, the distance between the center of rotation 438 and the end 439 of the actuator bracket 424 typically is substantially larger than the distance between the center of rotation 438 and the probe 204. As a result, a large displacement of the actuator shaft 442 causes a relatively small displacement of the probe 204, so that accuracy can be better controlled by the reduction factor. Of course, other ways of mounting the megasonic apparatus 104 and providing displacement of the probe 204 can be used.

Figure 14:
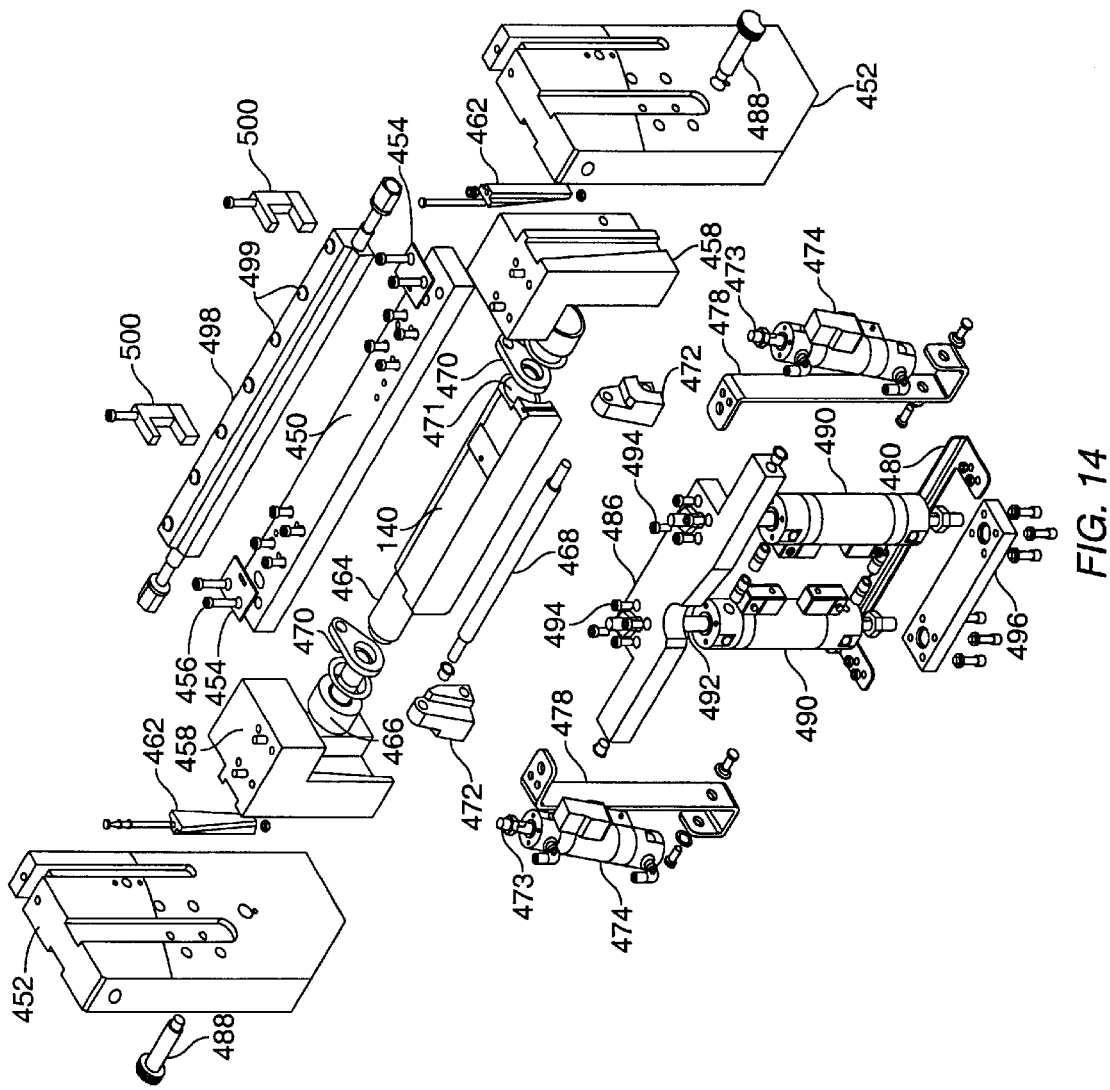
FIG. 14 is an exploded perspective view of a mounting and actuation mechanism for the chamber door in the densified fluid cleaning system of FIG. 3.
Figure 15:
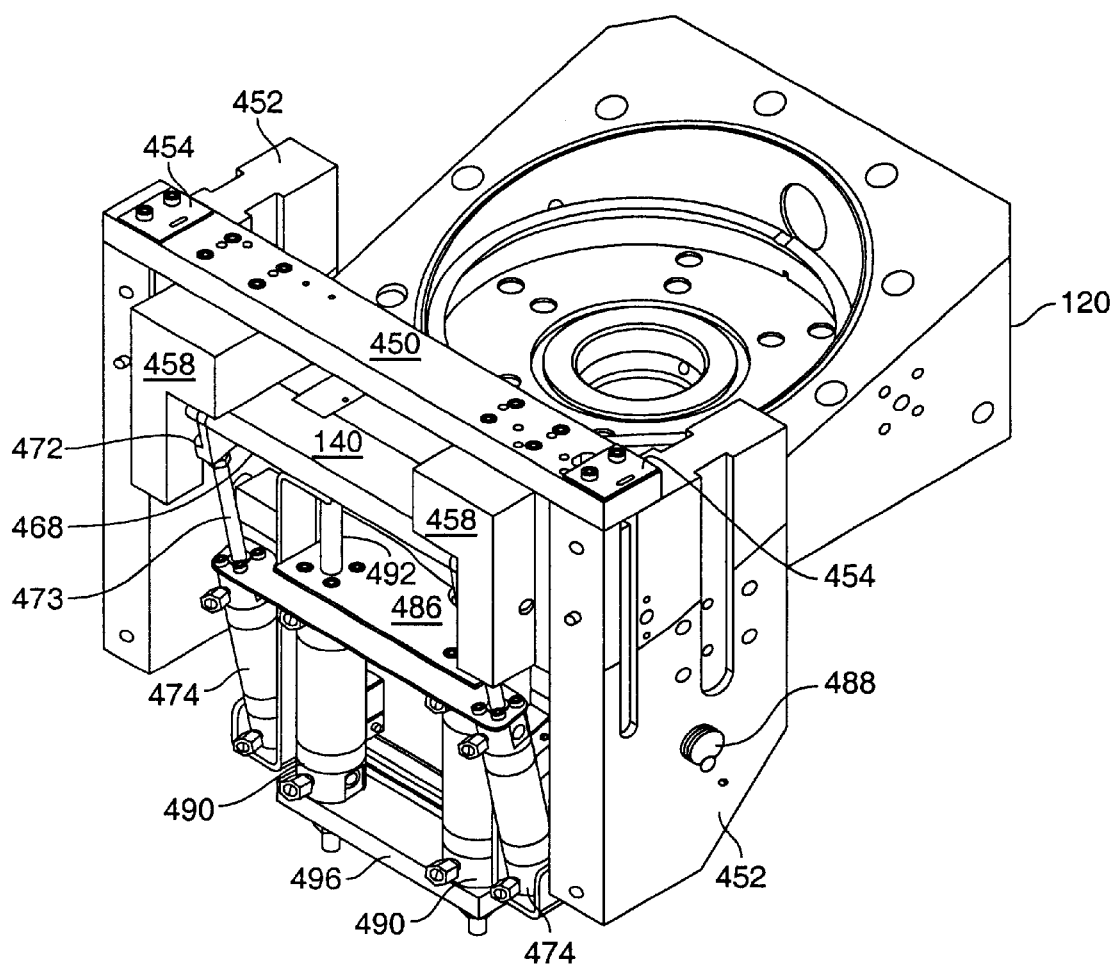
FIG. 15 is a perspective view of the assembled door mounting and actuation mechanism of FIG. 14.

FIGS. 14 and 15 show the mounting assembly for the chamber door 140 of the DFC chamber 102. The chamber door 140 is configured for open/close or in/out movement and for up/down movement to allow a transfer mechanism (not shown) to enter the chamber 102 to insert and retrieve the substrate 110. The door 140 is sealed against the chamber 102 using an EPDM seal (not shown). A top mounting bar 450 is connected between a pair of gussets 452 using a pair of top bar mounting plates 454 and fasteners 456. The gussets 452 are connected with the lower chamber portion 120. A pair of door retainer brackets 458 are mounted to the top mounting bar 450 adjacent the mounting blocks 452 using fasteners 460. A pair of tapered spacer blocks 462 are respectively disposed between the door retainer brackets 458 and the lower chamber portion 120 to ensure proper spacing and sealing of the door 140.

A fastener 457 is used to adjust position of each tapered spacer block 462 relative to the top mounting bar 450. Adjustment of the fastener 457 causes the tapered spacer block 462 to slide up and down against a correspondingly tapered surface machined on the inside of the retainer bracket 458. This causes adjustment of the gap between the retainer bracket 458 and chamber 102.

A door bushing 464 is mounted between the door retainer brackets 458 with a pair of door actuation cams 466. A door actuation arm 468 is connected with the door bushing 464 using a pair of door actuation brackets 470. The door bushing 464 extends through a hollow portion 471 of the door 140. The door actuation arm 468 is substantially parallel to the door bushing 464, and has connected at its two ends a pair of door actuation devises 472. The devises 472 are coupled with the actuator arms 473 of a pair of door open/close actuators 474, which are substantially parallel to each other. The door open/close actuators 474 are connected at the bottom to the lower ends of a pair of side actuator mounting brackets 478, respectively. The upper ends of the actuator mounting brackets 478 are coupled to a bracket spacer 480. When the door open/close actuators 474 extend the actuator arms 473 outward, the door actuation arm 468 is pushed to move the door 140 to close the chamber 102. When the open/close actuators 474 draw the actuator arms 473 inward, the door actuation arm 468 pulls the door 140 open.

An actuator alignment bracket 486 is disposed between the mounting blocks 452 and fixed by a pair of door assembly lock pins 488. A pair of door up/down actuators 490 are coupled to the actuator alignment bracket 486 and include actuator arms 492 that extend upward through a pair apertures 494 in the bracket 486. The door up/down actuators 490 are connected at the bottom to an actuator mounting bracket 496. The actuator arms 492 of the up/down actuators 490 are connected with threaded holes machined into the underside of the door 140. When the door up/down actuators 490 draw the actuator arms 492 inward, the actuator arms 492 pull the door 140 downward to allow transfer of the substrate 110 in and out of the chamber 102. When the door up/down actuators 490 extend the actuator arms 492 outward, the actuator arms 492 push the door 140 upward to be closed by the door open/close actuators 474.

A purge device 498 having apertures 499 are mounted to the top mounting bar 450 by mounting members 500 (FIG. 14). The purge device 498 is an embodiment of the purge curtain 160 shown in FIG. 3, which directs a flow of purge gas across the exterior of the door 140 to prevent or at least minimize the diffusion of the solvent out of the chamber 102 when the door 140 is opened during transfer of the substrate 110 into or out of the chamber 102.

3. Solvent Purification & Recirculation

The recycling and purification of the solvent such as ammonia minimizes waste products and saves costs. A number of apparatus for on-site purification of ammonia and similar solvents are disclosed in the art including, for example, U.S. Pat. Nos. 5,846,386, 5,833,738, 5,755,934, and 5,722,442. Some of the apparatus are specifically designed for use in semiconductor manufacturing. These patents are incorporated herein by reference in their entireties. The purifier 164 of the DFC system 100 as shown in FIG. 3 can employ any suitable technology for producing highly purified ammonia suitable for the DFC process.

Figure 16:
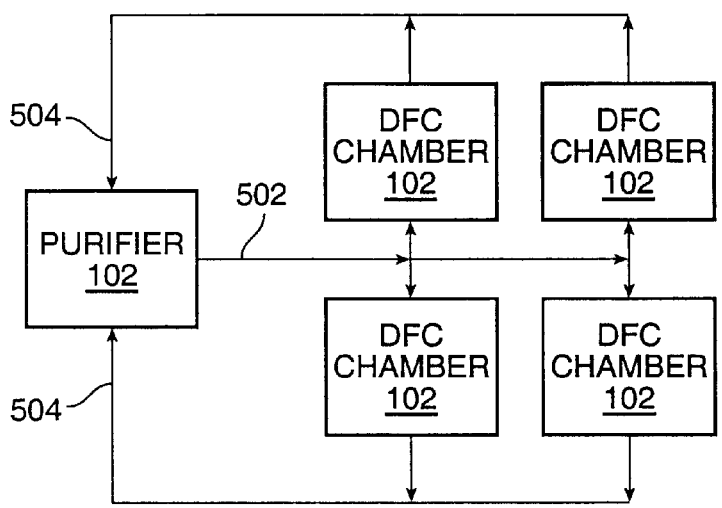
FIG. 16 is a block diagram of a solvent recirculation and purification system for multiple densified fluid cleaning chambers.

A single purifier 164 may be used for multiple DFC chambers, as illustrated in FIG. 16. In FIG. 16, the purifier 164 provides purified solvent via an output line 502 to four DFC chambers 102. The solvent exits the DFC chambers 102 and is recirculated to the purifier 164 via input lines 504. The use of a single purifier 164 can increase efficiency and make the DFC process more cost-effective.

C. System Control

1. Plasma Cleaning Control

Figure 17:
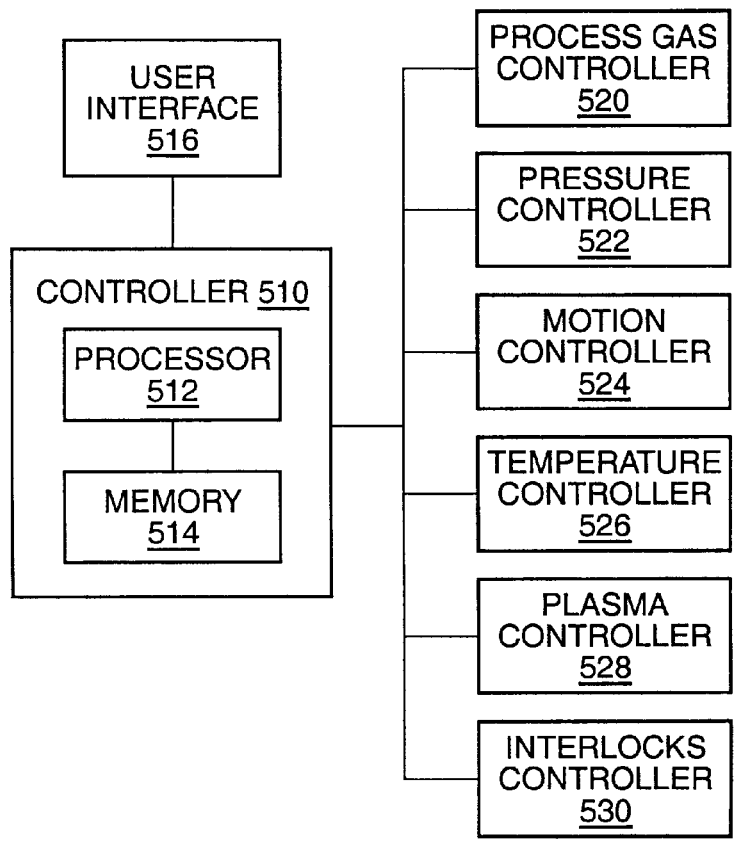
FIG. 17 is a block diagram of a control system for controlling operation of the plasma cleaning apparatus of FIG. 2.

The various components of the plasma cleaning apparatus 26 of FIG. 2 are controlled by a plasma system controller 510 as illustrated in the block diagram of FIG. 17. The controller 510 relies on feedback from various sensors and transducers for sensing positions of movable mechanical assemblies such as the reaction chamber door 36 and the substrate platen 34 of the reaction chamber 30 and for monitoring operating conditions such as pressure and temperature, and controls the various components of the plasma cleaning apparatus 26 to carry out the process as specified.

In a preferred embodiment, the plasma system controller 510 includes a processor 512 and a memory 514. The processor 512 typically includes analog and digital input/output boards, interface boards, and various controller boards. A user interface 516 is provided for receiving input instructions and displaying outputs. The interface 516 typically includes a CRT monitor and a keyboard or light pen.

The plasma system controller 510 controls all of the activities of the plasma cleaning apparatus 26 by managing a plurality of controllers, including a process gas controller 520, a pressure controller 522, a motion controller 524, a temperature controller 526, a plasma controller 528, and an interlocks controller 530.

The process gas controller 520 controls the flow of process gas from the gas source 32 through the remote plasma generating region 28 and the reaction chamber 30. The pressure controller 522 controls the pressure in the plasma reaction chamber 30. The motion controller 524 manipulates the positioning of the substrate 10 and controls operation of the chamber door 36. The temperature controller 526 controls the temperature of the platen 34. The plasma controller 528 controls production of microwave energy for generating plasma in the plasma generation region 28. The interlocks controller 530 controls the interlocks which are provided in the plasma cleaning apparatus 26 for coordinating or synchronizing the operation and movement of the various components of the apparatus to avoid mishaps. For instance, the interlocks controller 530 prevents opening of the chamber door 36 during the plasma cleaning procedure when the reactive species are flowed to the reaction chamber 30 and the desired pressure is produced in the chamber 30 by the vacuum pump 40.

The plasma system controller 510 controls the operation of the various controllers by executing system control software, which is a computer program stored in a computer-readable medium such as the memory 514. The memory 514 is typically a hard disk drive. The computer program includes sets of instructions that dictate the process gas mixing, chamber pressure, chamber temperature, microwave power levels, and other parameters of the plasma clean process. The computer program code can be written in any known computer readable programming language.

Figure 18:
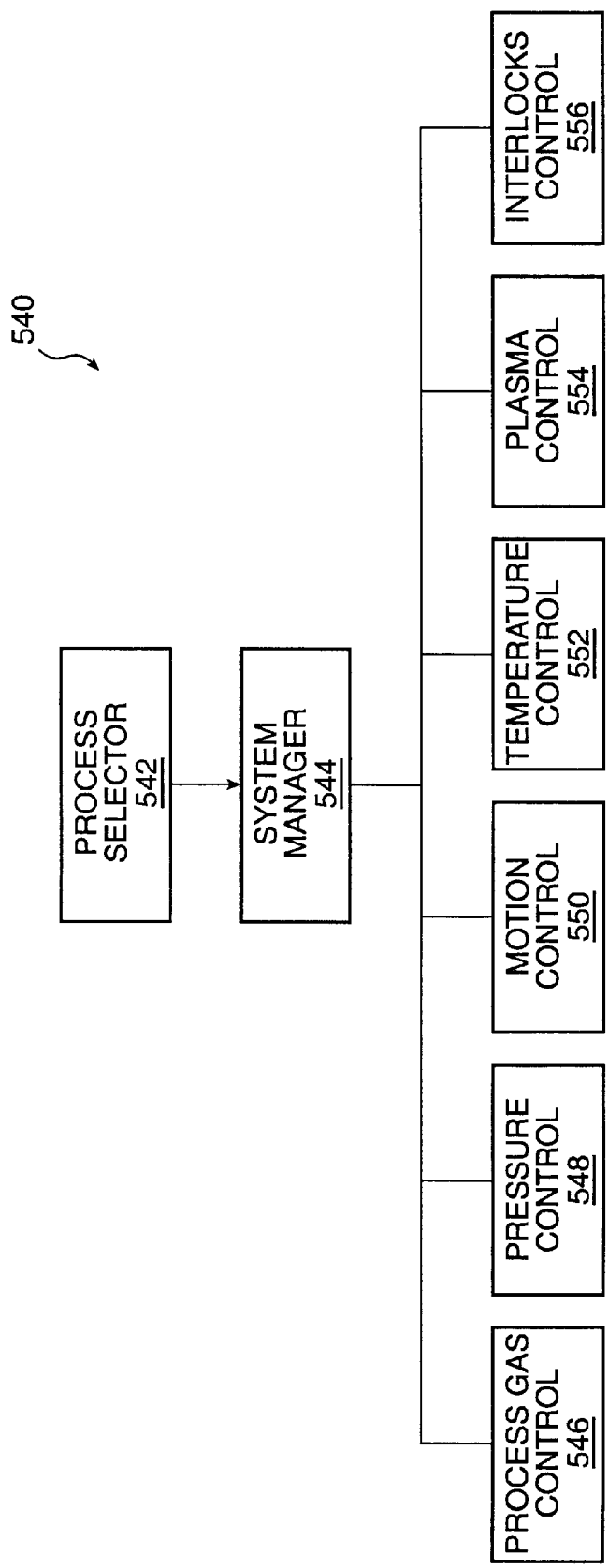
FIG. 18 is a block diagram of a hierarchical control structure of the system control software for controlling operation of the plasma cleaning apparatus of FIG. 2.

FIG. 18 is a block diagram of an embodiment of the hierarchical control structure of the system control software or computer program 540. Input parameters and instructions entered into the user interface 516 are supplied to a process selector 542 for performing a specific plasma clean process according to the specified process conditions. A system manager subroutine 544 comprises program code for accepting the specified parameters for the particular plasma clean process from the process selector subroutine 542 and controlling the operation of the plasma cleaning apparatus 26. The system manager subroutine 544 controls execution of a number of component subroutines that control operation of the various components of the plasma cleaning apparatus 26. Examples of these subroutines are process gas control subroutine 546, pressure control subroutine 548, motion control subroutine 550, temperature control subroutine 552, plasma control subroutine 554, and interlocks control subroutine 556. In operation, the system manager subroutine 544 selectively schedules or calls the component subroutines according to the particular plasma clean process specified by the user. Of course, additional subroutines can be provided depending on the type of process required.

The process gas control subroutine 546 has program code for operating the process gas controller 520 to control the process gas composition and flow rates into the remote plasma generating region 28 (see FIG. 2). The process gas control subroutine 546 receives flow rate parameters from the system manager subroutine 544 and directs the controller 520 to operate the mass flow controller and/or valves to obtain the desired flow rates, and to control the opening and closing of safety shut-off valves. The process gas control subroutine 546 reads flow rate outputs in various flow meters and includes steps to adjust the necessary valves and flow controllers to achieve the desired flow rates. The subroutine 520 further contains steps for activating safety shut-off valves when the monitored flow rates indicate tat the operating conditions are unsafe.

The pressure control subroutine 548 contains program code for operation of the pressure controller 522 to control the pressure in the plasma reaction chamber 30 by regulating the vacuum pump 40 or an exhaust valve or the like in relation to the input gas flow from the plasma generating region to the chamber 30 (see FIG. 2). The pressure control subroutine 548 receives the target pressure level from the system manager subroutine 544, reads the chamber pressure level from pressure gauges or manometers coupled to the chamber 30, and adjusts the level of the vacuum pump 40 when necessary to achieve the target pressure.

The motion control subroutine 550 has program code for operation of the motion controller 524 to control the components for positioning the substrate 10, including the platen 34 and chamber door 36 (see FIG. 2). Position sensors are typically used to provide feedback data to the motion control subroutine 550 which determines whether adjustment is necessary for the platen 34 and chamber door 36.

The temperature control subroutine 552 receives temperature parameters from the system manager subroutine 544, and contains program code for operation of the temperature controller 526 to control a heater to achieve the specified temperature for the platen 34 (see FIG. 2). For instance, the temperature control subroutine 552 reads temperature measured by thermocouples coupled to the platen 34 and adjusts the heat transfer with the platen 34 to obtain the desired temperature.

The plasma control subroutine 554 has program code for operating the plasma controller 528 to set the power level of the microwave power source to the plasma generating region 28 (see FIG. 2). Similar to the previously described chamber component subroutines, the plasma control subroutine 554 is invoked by the chamber manager subroutine 544.

The interlocks control subroutine 556 has program code for operation of the interlocks controller 530 to coordinate or synchronize the proper operation of the components of the plasma cleaning apparatus 26 (see FIG. 2). The interlocks control subroutine 556 identifies components that are interrelated in operation. When any of the other system component control subroutine 546–554 receives instruction to change the status of a particular component of the plasma cleaning apparatus 26, the interlocks control subroutine 556 provides steps for monitoring and checking the statuses of interrelated components before allowing the change in status to occur for that component. This prevents the occurrence of accidents and malfunctioning of the plasma cleaning apparatus 26.

2. Densified Fluid Cleaning Control

Figure 19:
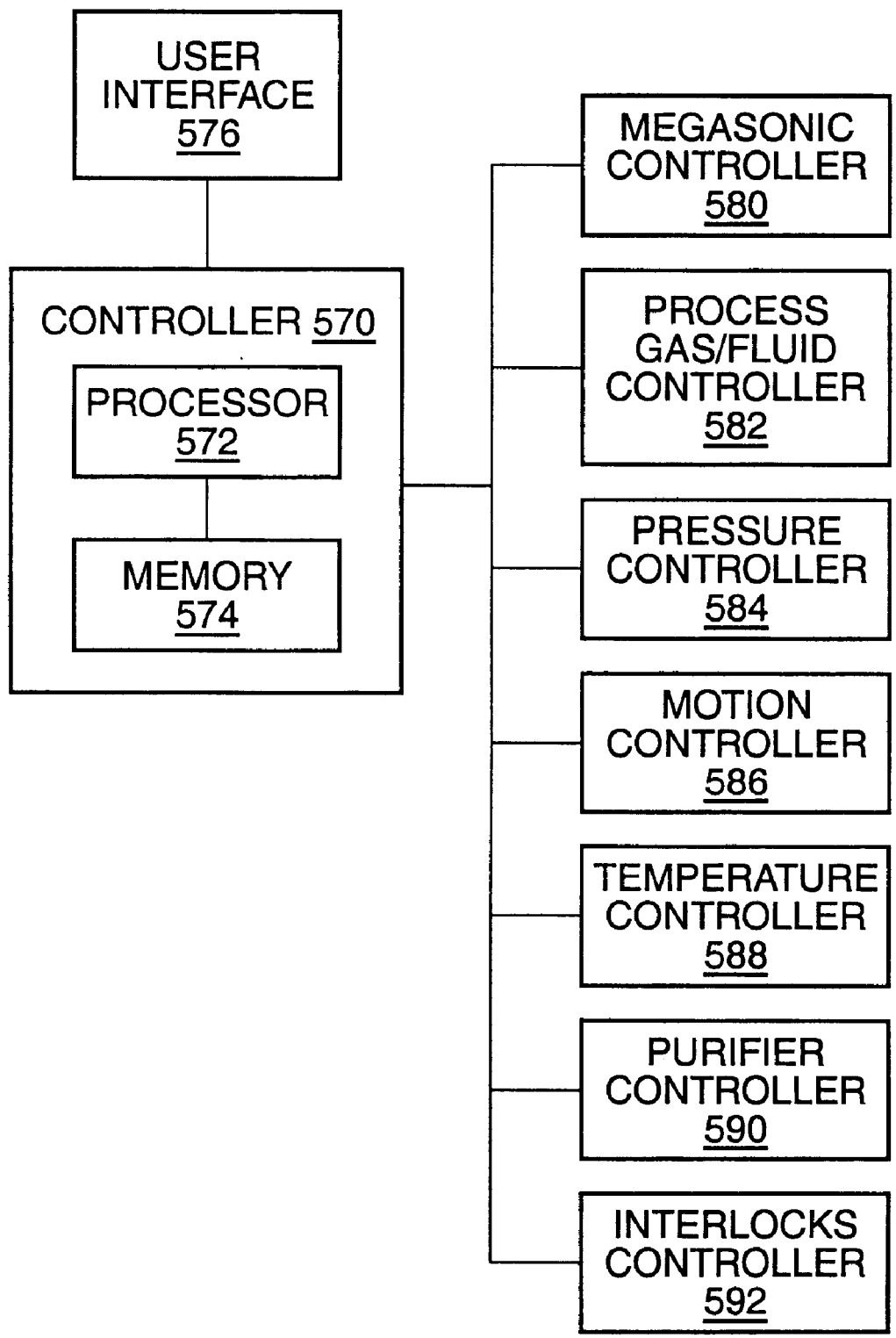
FIG. 19 is a block diagram of a control system for controlling operation of the densified fluid cleaning system of FIG. 3.

The components of the DFC system 100 of FIG. 3 are controlled by a DFC system controller 570 as illustrated in the block diagram of FIG. 19. The controller 570 relies on feedback from various sensors and transducers for sensing positions of movable mechanical assemblies such as the door 140 and substrate lifting mechanism 370 and monitoring operating conditions such as pressure and temperature, and controls the various components of the DFC system 100 to carry out the process as specified.

In a preferred embodiment, the DFC system controller 570 includes a processor 572 and a memory 574, and is coupled with amuser interface 576. The processor 572, memory 574 and user interface 576 for the DFC system controller 570 are typically similar to the processor 512, memory 514 and user interface 516 for the plasma system controller 510. The DFC system controller 570 controls all of the activities of the DFC system 100 by managing a plurality of controllers, including a megasonic controller 580, a process gas/fluid controller 582, a pressure controller 584, a motion controller 586, a temperature controller 588, a purifier controller 590, and an interlocks controller 592.

The megasonic controller 580 controls operation of the megasonic apparatus 104, including positioning of the probe 204 and activation of the transducer 210. The process gas/fluid controller 582 controls the flows of the solvent 162, purge gas 156, and coolant 127, and their flow rates. The pressure controller 584 controls the pressure in the DFC chamber 102. The motion controller 586 manipulates the positioning of the substrate 110 by controlling the spindle 114, platen 108, substrate lifting mechanism 370, and vacuum 138 as well as the substrate transfer device for moving the substrate 110 in and out of the chamber 102, and controls operation of the chamber door 140. The temperature controller 588 controls operation of the chamber wall heaters 124, the solvent heater 166, and the recirculating chiller 128 to achieve the specified temperatures. The purifier controller 590 controls operation of the purifier 164. The interlocks controller 592 controls the interlocks which are provided in the DFC system 100 to coordinate or synchronize the operation and movement of the various components of the system to avoid mishaps. For instance, the interlocks controller 592 prevents opening of the purge gas valves 148, 150 when the solvent valves 152, 154 are opened during a cleaning procedure and vice versa. The interlocks controllers 592 also prevents opening of the chamber door 140 during the cleaning procedure when the chamber 102 is pressurized.

The DFC system controller 570 controls the operation of the various controllers by executing system control software, which is a computer program stored in a computer-readable medium such as the memory 574. The computer program includes sets of instructions that dictate the flow rates and pressure levels of the process gas and purge gas, chamber pressure, chamber temperature, megasonic energy level, and other parameters of the plasma clean process. The computer program code can be written in any known computer readable programming language.

Figure 20:
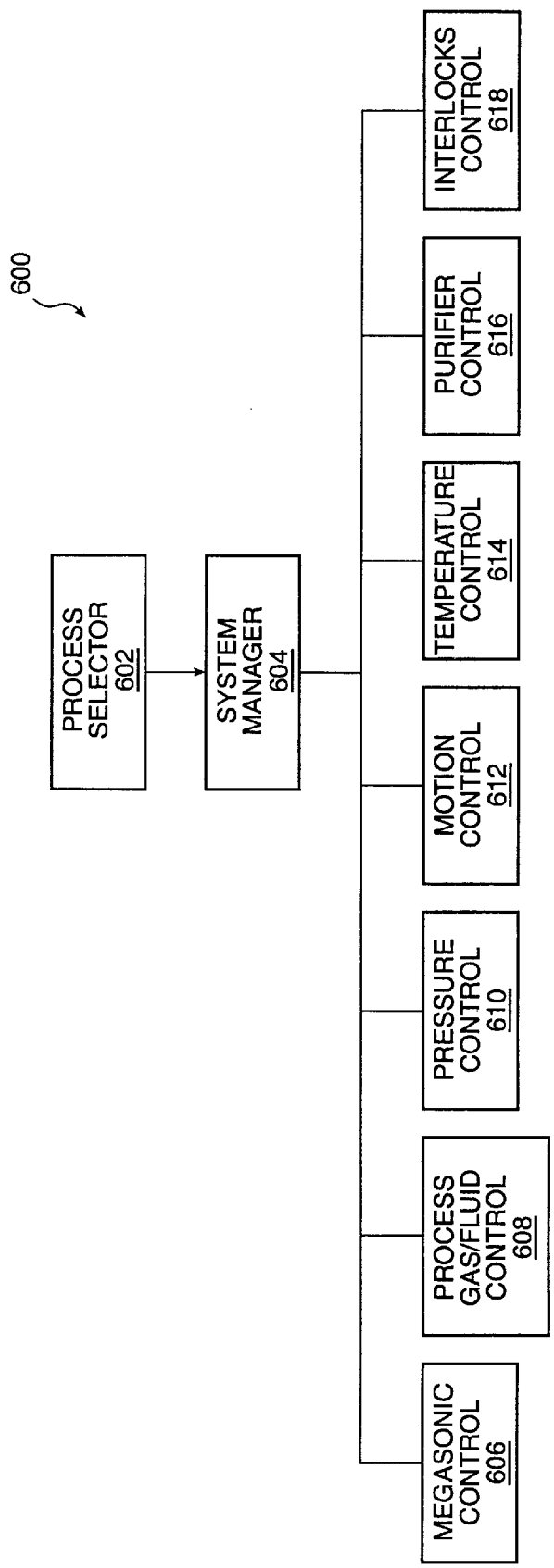
FIG. 20 is a block diagram of a hierarchical control structure of the system control software for controlling operation of the densified fluid cleaning system of FIG. 3.

FIG. 20 is a block diagram of an embodiment of the hierarchical control structure of the system control software or computer program 600. Input parameters and instructions entered into the user interface 576 are supplied to a process selector 602 for performing a specific DFC process according to the specified process conditions. A system manager subroutine 604 comprises program code for accepting the specified parameters for the particular DFC process from the process selector subroutine 602 and controlling the operation of the DFC system 100. The system manager subroutine 604 controls execution of a number of component subroutines that control operation of the various components of the DFC system 100. Examples of these subroutines are megasonic control subroutine 606, process gas/fluid control subroutine 608, pressure control subroutine 610, motion control subroutine 612, temperature control subroutine 614, purifier control subroutine 616, and interlocks control subroutine 618. In operation, the system manager subroutine 604 selectively schedules or calls the component subroutines according to the particular DFC process specified by the user. Of course, additional subroutines can be provided depending on the type of process required.

The megasonic control subroutine 606 contains program code for operation of the megasonic controller 580 to control positioning of the probe 204 in the DFC chamber 102 and activation of the transducer 210 to produce the specified energy level. As all system component subroutines, the megasonic control subroutine 606 is invoked by the system manager subroutine 604, and receives from the system manager subroutine 604 parameters related to the position of the probe 204 and megasonic energy level. Typically, the megasonic control subroutine 606 operates by moving the actuator 440 to rotate the actuator bracket 424 to obtain the desired vertical displacement of the probe 204 through the driver bushing 430 and eccentric bushing 428 (see FIGS. 11–13). The megasonic control subroutine 606 further adjusts the megasonic energy for the transducer 210 to the specified energy level.

The process gas/fluid control subroutine 608 has program code for operation of the process gas/fluid controller 582 to control the flows of the solvent 162, purge gas 156, and coolant 127 (see FIG. 3). The process gas/fluid control subroutine 608 receives flow rate parameters from the system manager subroutine 604 and directs the controller 582 to operate the mass flow controllers and/or valves to obtain the desired flow rates, and to control the opening and closing of safety shut-off valves. The process gas/fluid control subroutine 608 reads flow rate outputs in various flow meters and includes steps to adjust the necessary valves and flow controllers to achieve the desired flow rates. The subroutine 608 also contains steps for activating safety shut-off valves when the monitored flow rates indicate the existence of unsafe conditions.

The pressure control subroutine 610 contains program code for operation of the pressure controller 584 to control the pressure in the chamber 102 by regulating the exhaust valve 154 in relation to the input gas flow at the entry port 106 and the size of the chamber 102 (see FIG. 3). The pressure control subroutine 610 receives the target pressure level from the system manager subroutine 604, reads the chamber pressure level from pressure gauges or manometers coupled to the chamber 102, and adjusts the size of the exhaust valve 154 when necessary to achieve the target pressure.

The motion control subroutine 612 has program code for operation of the motion controller 586 to control the components for positioning the substrate 110 onto the platen 108, including the spindle 114, substrate lifting mechanism 370, vacuum 138, chamber door 140, and substrate transfer device. During the cleaning procedure, the motion control subroutine 612 provide instructions for controlling rotation of the spindle 114 and platen 108 by monitoring the rotational speed and adjusting the servo-controlled motor 116 when necessary to achieve the desired speed.

The temperature control subroutine 614 receives temperature parameters from the system manager subroutine 604, and contains program code for operation of the temperature controller 588 to control the chamber wall heaters 124, the solvent heater 166, and the recirculating chiller 128 to achieve the specified temperatures (see FIG. 3). For instance, the temperature control subroutine 614 reads temperature measured by thermocouples coupled to the upper chamber walls and adjusts the wall heater 124 to achieve the specified wall temperature. The temperature control subroutine 614 also reads temperature measured by thermocouples connected with the platen 108 and adjusts the recirculating chiller 128 to obtain the desired temperature for the platen 108. The heater 166 is also monitored and controlled to achieve the desired temperature for the solvent.

The purifier control subroutine 616 receives purity parameters from the system manager subroutine 604, and contains program code for operation of the purifier controller 590 to monitor the purity level of the solvent and control the purifier 164 to achieve the desired purity level for the recycled solvent.

The interlocks control subroutine 618 has program code for operation of the interlocks controller 592 to coordinate or synchronize the proper operation of the components of the DFC system 100. The interlocks control subroutine 618 identifies components that are interrelated in operation. When any of the other system component control subroutines 606–616 receives instruction to change the status of a particular component of the DFC system 100, the interlocks control subroutine provides steps for monitoring and checking the statuses of interrelated components before allowing the change in status to occur for that component. This prevents the occurrence of accidents and malfunctioning of the DFC system 100.

3. Integrated Control

Figure 21:
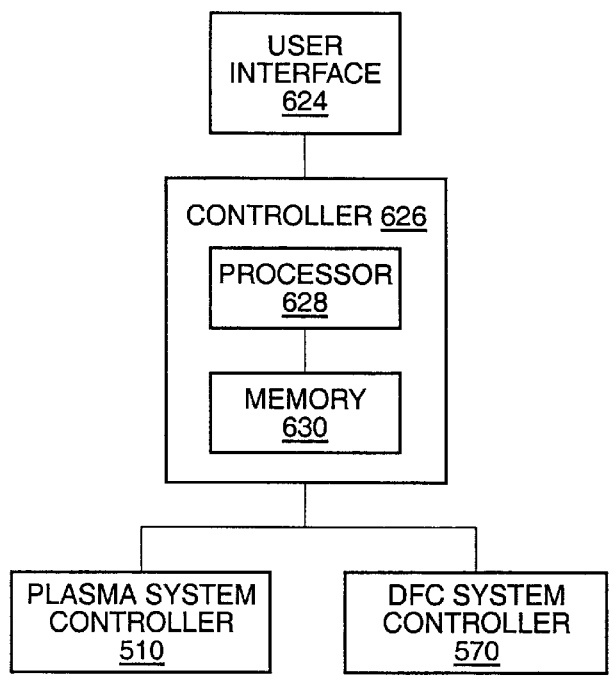
FIG. 21 is a block diagram of an integrated control system for controlling operation of the plasma cleaning apparatus of FIG. 2 and the DFC system of FIG. 3.

The plasma cleaning apparatus 26 and the DFC system 100 may be packaged on one platform. They may also be controlled by an integrated controller as illustrated in FIG. 21. A single user interface 624 is provided to interface with an integrated controller 626 having a processor 628 and a memory 630. The integrated controller 626 controls both the plasma system controller 510 and the DFC system controller 570. The plasma system controller 510 in turn controls the controllers 520–530 for operation of the plasma cleaning apparatus 26, and the DFC system controller 570 controls the controllers 580–592 for operation of the DFC system 100.

III. Post-Etch Residue Removal Process

Figure 22:
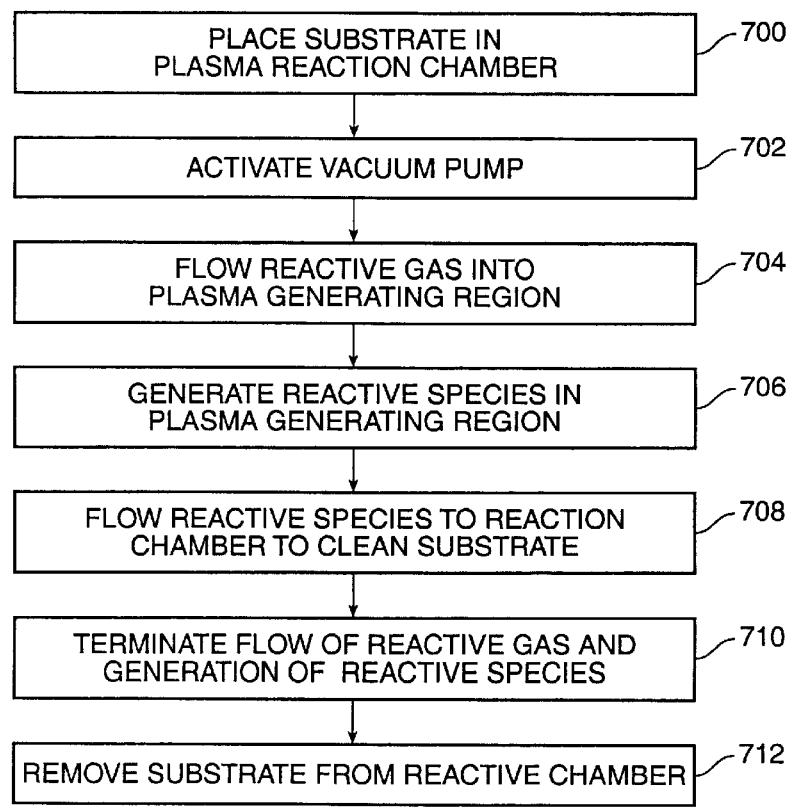
FIG. 22 is a flow diagram of an embodiment of a plasma cleaning process in accordance with the present invention.

FIG. 22 is a flow diagram of an embodiment of a plasma cleaning process employing the plasma cleaning apparatus 26 of FIG. 2. In step 700, the substrate 10 is placed on the platen 34 inside the plasma cleaning reaction chamber 30. The platen 34 is heated to the desired temperature, which is typically about 30–90° C. The chamber door 36 is closed. The vacuum pump 40 is turned on in step 702 to bring the pressure inside the reaction chamber 30 to the desired level which is typically about 1–2.5 Torr. In step 704, a reactive gas is flowed from the gas source 32 to the plasma generating region 28. A gas mixture of $NF_3$ and $O_2$ is typically, with flow rates of about 50–250 sccm for $NF_3$ and about 2000–5000 sccm for $O_2$. A plasma is generated in step 706 to produce reactive species from the reactive gas inside the plasma generating region 28. The generation of the plasma species may employ a remote plasma generator by applying microwave energy or the like or an in situ system using radiofrequency or the like. Step 708 flows the reactive species from the plasma generating region 28 to the reaction chamber 30 where the reactive species react with the substrate to remove at least a portion of the photoresist residues or other adherent matrix materials.

The cleaning process is carried out for a desired period of time before the gas flow and the microwave-energy for generating reactive species in the plasma generating region are terminated in step 710. The time for processing typically employs an end of process (EOP) criterion. The EOP is determined by measurements taken by a sensor or detector such as an optical or spectral detector for monitoring the species emitted during the processing. For instance, certain species are emitted during removal of a photoresist from the substrate during the plasma process. An EOP can be established when the emissions produced by photoresist falls below a certain concentration level, indicating that the photoresist has been substantially removed. Typically the process time is set to en EOP plus an extra amount of time. In a specific example, the time is equal to EOP +55 seconds. In step 712, the vacuum pump 40 is turned off and the substrate 10 is removed from the reaction chamber 30. Prior to removal of the substrate 10, an optional purge step by flowing nitrogen gas through the reaction chamber 30 may be performed.

Figure 23:
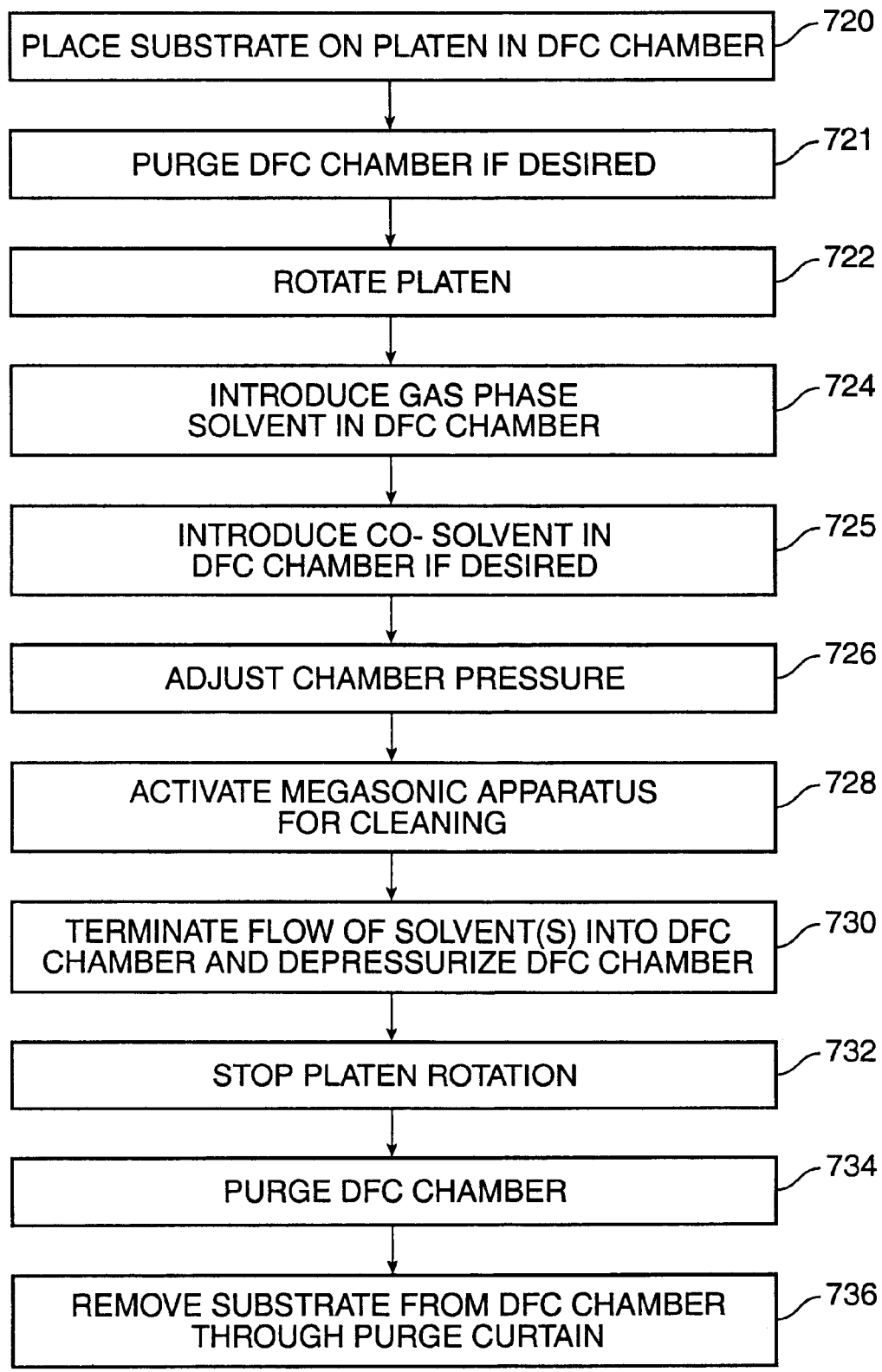
FIG. 23 is a flow diagram of an embodiment of a densified fluid cleaning process in accordance with the present invention.

FIG. 23 is a flow diagram of an embodiment of a densified fluid cleaning process employing the DFC system 100 of FIG. 3. In step 720, the substrate 110 which preferably has undergone the plasma cleaning process of FIG. 22 is placed on the platen 108 inside the DFC chamber 102. The substrate 110 is typically allowed to cool after the plasma cleaning process before it is brought into the DFC chamber 102. The chamber door 140 is closed. The heaters 124 are turned on to heat the upper chamber portion 118 of the DFC chamber 102 to a desired temperature, which is typically about 65–80° C. The coolant is flowed into the coolant channels 126, 132, 134 to cool the lower chamber portion 120 and the platen 108 to temperatures of typically about 15–70° C. If desired, a purge using a purge gas such as nitrogen helium, or argon may be performed in step 721. This step may purge the chamber of oxygen and water moisture to minimize oxidation of copper or the like contained in the substrate.

After the substrate 110 is properly positioned on the platen 108, step 722 rotates the platen 108 to a desired rotational speed, which is typically higher than about 15 rpm, more desirably about 15–150 rpm. Rotating the substrate 110 provides more uniform cleaning. An appropriate rotational speed is important to maintain the coupling between the megasonic probe 204 and the densified fluid on the surface of the substrate 110. If the speed is too high, the densified fluid layer will diminish in thickness and may lose coupling with the megasonic probe 204. Rotating the substrate 110 also ensures all parts of substrate 110 is exposed to the sonic energy.

In step 724, the gas phase solvent such as ammonia, which has been heated by the heater 166 to a temperature of typically about 80–90° C. and pressurized to a pressure of about 600–800 psi, is introduced into the DFC chamber 102 by opening the solvent inlet valve 152 and closing the purge inlet valve 148. If desired, a co-solvent can also be introduced into the DFC chamber 102 in vapor form (FIG. 3A) or liquid form (FIG. 3B) in step 725.

In step 726, the purge outlet valve 150 is closed and the solvent outlet valve 154 is opened and adjusted to achieve a desired pressure inside the DFC chamber 102. The pressure inside the DFC chamber 102 is typically ramped up gradually to a generally steady state value of about 250–450 for the cleaning process. Subsequent depressurization and repressurization can be used to control condensation and vaporization of the solvent to achieve improved cleaning. The solvent is preferably recirculated through the purifier 164. In step 728, the megasonic probe 204 of the megasonic apparatus 104 is placed in close proximity with the surface of the substrate 110 and activated to transfer sonic energy through the densified fluid condensed on the surface of the substrate 110 to the substrate 110. The gap between the probe 204 and the surface of the substrate 110 is typically about 100–300 μm. The megasonic input power is typically about 50–70 W and the frequency is typically about 400–900 kHz. The megasonic energy assisted densified fluid cleaning is performed for a preset period of time which depends on the particular structure of the substrate 110 and the type of residue or adherent matrix material being removed. In post-etch residue removal processes, a process time of about 1–2 minutes is typical.

At the end of the specified process time period, the megasonic apparatus 104 is turned off and the solvent inlet valve 152 is closed. The solvent outlet valve 154 is adjusted to ramp down the pressure inside the DFC chamber 102 gradually to approximately atmospheric pressure in step 730. Rotation of the platen 108 is terminated in step 732. In step 734, the purge gas such as nitrogen from source 156 is flowed through the DFC chamber 102 by opening the purge inlet valve 148 and the purge outlet valve 150. After purging for a desired period of time, the purge valves 148, 150 are closed and the substrate 110 is removed from the DFC chamber 102 in step 736. When the chamber door 140 is opened to transfer the substrate 110 into and out of the chamber 102, the purge curtain 160 is preferably turned on to minimize the diffusion of the solvent out of the chamber 102.

The various process parameters can be optimized based on the particular device structure and materials of the substrate 110, the nature of the residues or adherent matrix materials (e.g., etch equipment etch recipes, and shape of the vias or trenches). Sample runs can be made to determine desirable ranges for each parameter which can then be used for actual cleaning.

IV. Experiments and Test Results

To demonstrate the operation of the apparatus and method according to embodiments of the present invention, experiments were performed to clean a substrate having a via with post-etch residues and a substrate having metal lines or trenches with post-etch residues.

Figure 24A:
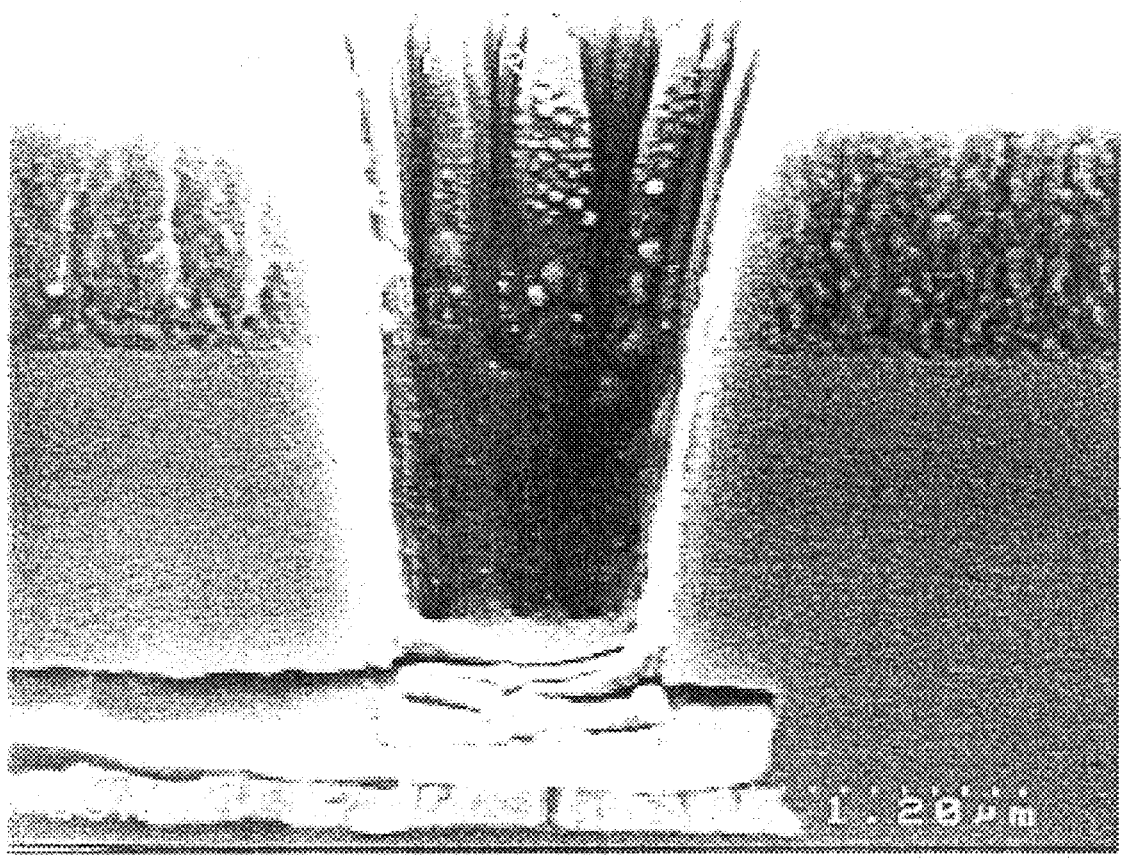
FIG. 24a is a photomicrograph of a substrate having a via with post-etch residues prior to cleaning.

In the first experiment, the wafer structure as shown in FIG. 24a had an oxide layer deposited using a process gas that included TEOS (tetraethylorthosilicate). The TEOS oxide layer was about 21,000 Å in thickness. The substrate had vias with metal layers at the bottom. The metal layers included a Ti/TiW layer of about 350 Å in thickness and an AlSi/Cu layer of about 4,500 Å in thickness disposed over the Ti/TiW layer. A photoresist layer was formed on top of the TEOS oxide layer and had a thickness of about 12,000 Å. A thin polymeric crust was observed on top of the photoresist layer. Polymeric residues were formed during the etch process at the bottom and side surfaces of the vias.

A plasma cleaning process was performed on the substrate of FIG. 24a according to the steps described in FIG. 22. The following process parameters were used: a process gas including $NF_3$ and $O_2$, an $NF_3$ flow rate of about 150 sccm, an $O_2$ flow rate of about 4000 sccm, a chamber temperature of about 30° C., a chamber pressure of about 1.2 Torr, a power level of about 1000 W, and a process time of EOP+55 seconds where the EOP set for photoresist removal is 55 seconds. These parameters were used for a quarter of a 150-mm wafer. No attempt was made to optimize the process by varying the parameters.

Figure 24B:
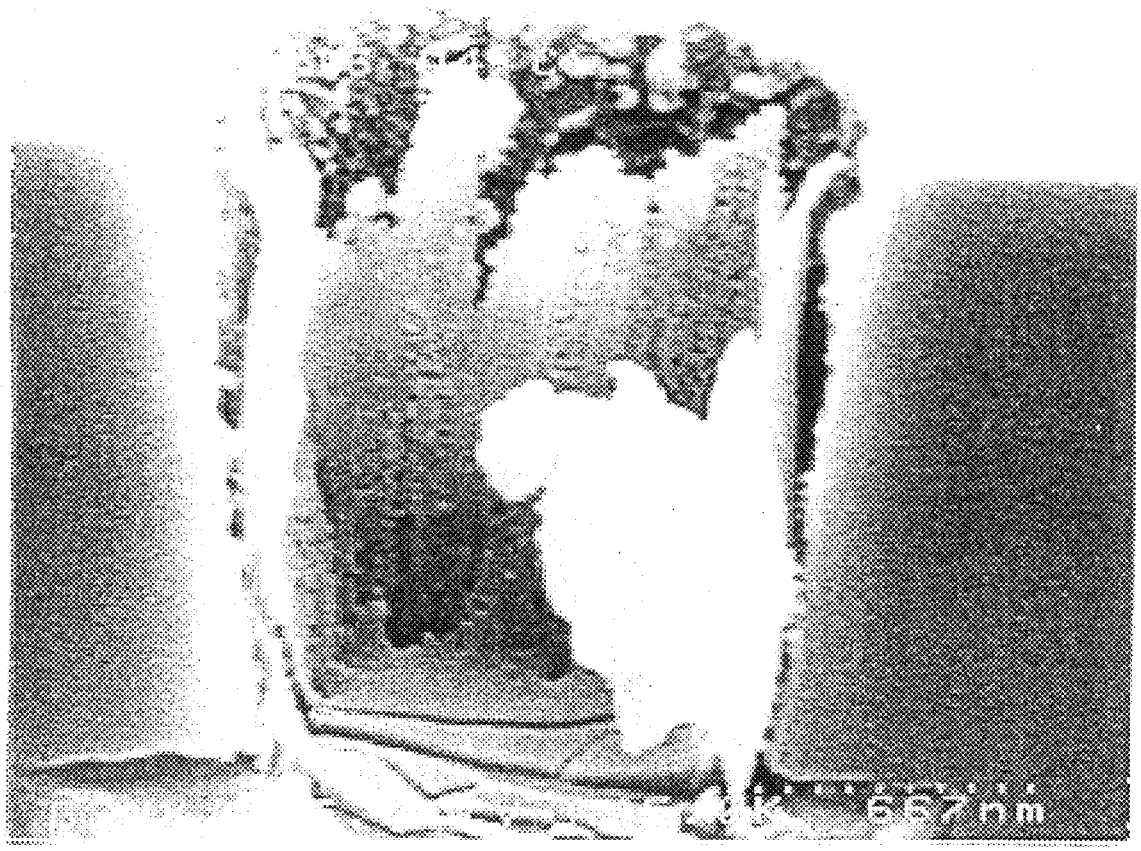
FIG. 24b is a photomicrograph of the substrate of FIG. 22a after a plasma cleaning step.

FIG. 24b shows the substrate of FIG. 24a after the plasma cleaning process. Almost all of the photoresist layer was removed with some residual portions of the photoresist layer and polymeric crust remaining over the TEOS oxide layer. The polymeric residues at the bottom and side surfaces of the via shown remained. The increased porosity and partial fragmentation of the residual portions of the photoresist layer and polymeric crust and the polymeric residues in the via were evident. Chemical changes due to reaction with the plasma species were believed to have occurred. FIG. 24b shows some peeling of the polymeric residues from the side surface of the via, but the peeling might have been caused by mechanical stresses induced during dissection of the substrate in order to take the photomicrograph.

A DFC process was subsequently performed on the substrate of FIG. 24b according to the steps described in FIG. 23. The following process parameters were used: ammonia solvent injected at an initial temperature of about 80° C. and initial pressure of about 600 psi, a platen rotational speed of about 20 rpm, a megasonic input power of about 60 W and a frequency of about 837 kHz, a chamber pressure which is raised to a generally constant level of about 300 psi; a chamber wall temperature of about 75–80° C.; a wafer temperature of about 17° C. initially and quickly rising to a substantially steady level at about 300° C., a process time of about 60 seconds. The rise in temperature for the wafer was caused by the condensation of the warm ammonia vapor on the wafer surface. These parameters were used for a quarter of a 150-mm wafer. No attempt was made to optimize the process by varying the parameters.

Figure 24C:
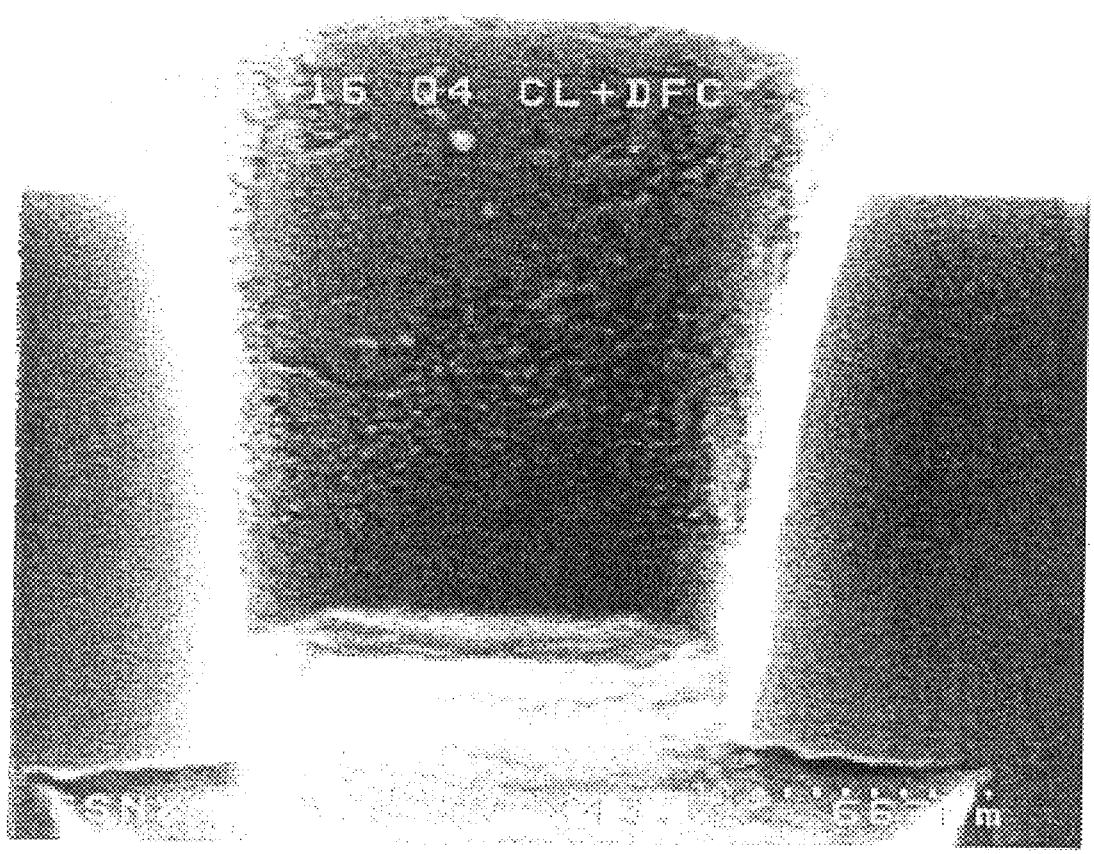
FIG. 24c is a photomicrograph of the substrate of FIG. 22b after a subsequent densified fluid cleaning step.

FIG. 24c shows the substrate of FIG. 24b after the DFC process. The top of the TEOS oxide layer and the via surfaces were free of photoresist and residues. The residual portions of the photoresist layer and polymeric crust as well as the polymeric residues at the bottom and side surfaces of the via underwent physical and chemical changes during the plasma cleaning process that rendered them more amenable to attack by the ammonia during the subsequent DFC process. The Al/Si/Cu and Ti/TiW layers at the bottom of the via were undamaged. The side wall surface of the via appeared coarse. The roughening of the side wall is believed to have been caused by plasma attack during the plasma cleaning process. This effect may be minimized or eliminated by adjusting the plasma process parameters and optimizing the processes to obtain a smooth surface.

Figure 25A:
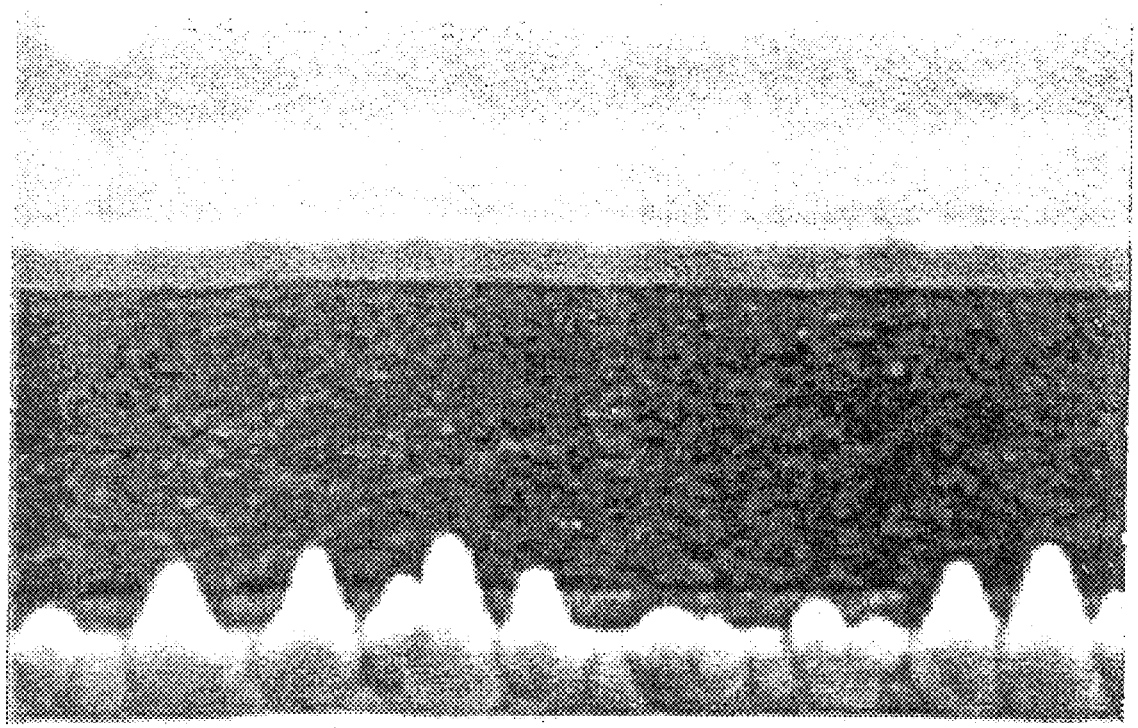
FIG. 25a is a photomicrograph of a substrate having a metal trench with post-etch residues prior to cleaning.

In the second experiment, the wafer structure as shown in FIG. 25a had a plurality of metal lines formed over a TEOS oxide layer. The metal lines included the following materials from the top: SiON of less than about 100 Å, TiN of about 275 Å, Al of about 3,700 Å, TiN of about 275 Å, and Ti of about 200 Å. A plurality of trenches were formed with polymeric residues disposed on the bottom and side surfaces. A photoresist layer of about 5,000 Å with a thin polymeric crust was formed on top of the metal lines.

A plasma cleaning process was performed on the substrate of FIG. 25a according to the steps described in FIG. 22. The same process parameters as those specified above for cleaning the substrate of FIG. 24a were used for a quarter of a 200-mm wafer. No attempt was made to optimize the process by varying the parameters.

Figure 25B:
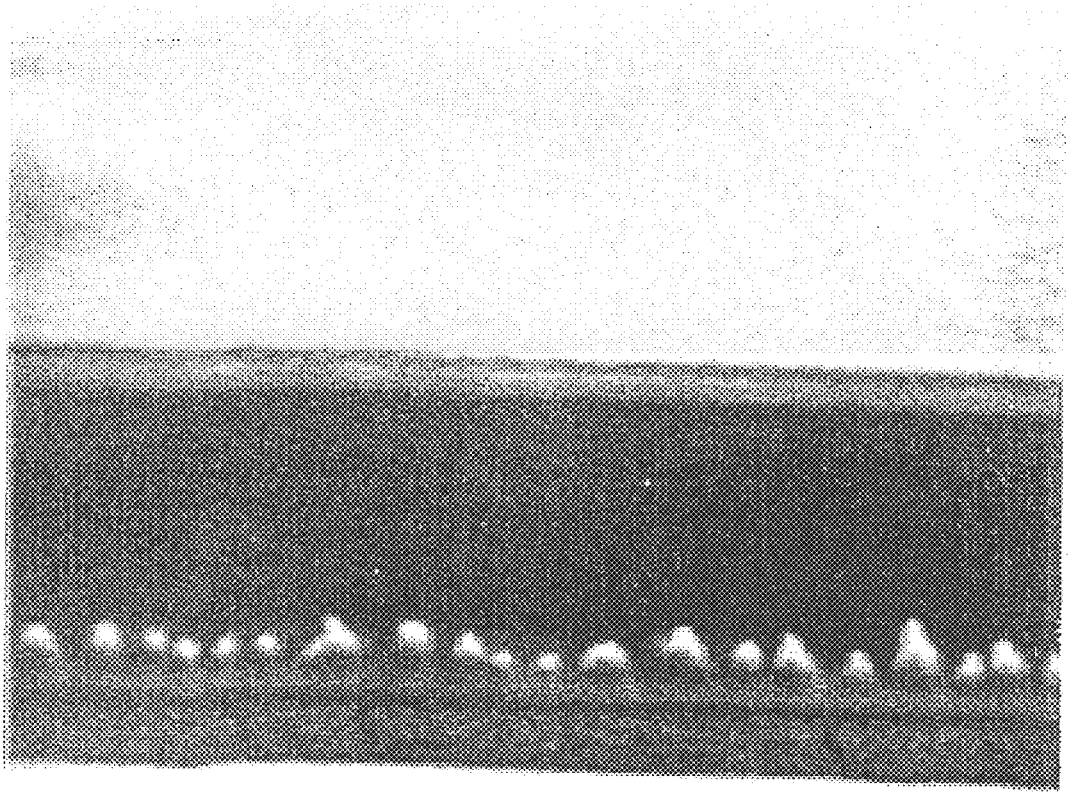
FIG. 25b is a photomicrograph of the substrate of FIG. 23a after a plasma cleaning step.

FIG. 25b shows the substrate of FIG. 25a after the plasma cleaning process. Almost all of the photoresist layer was removed leaving some residual portions of the photoresist layer and polymeric crust over the TEOS oxide layer. The polymeric residues at the bottom and side surfaces of the trench shown were still present, but had a different appearance due to chemical and physical changes from the plasma attack.

A DFC process was subsequently performed on the substrate of FIG. 25b according to the steps described in FIG. 23. The same process parameters as those specified above for cleaning the substrate of FIG. 24b were used for a quarter of a 200-mm wafer. No attempt was made to optimize the process by varying the parameters.

Figure 25C:
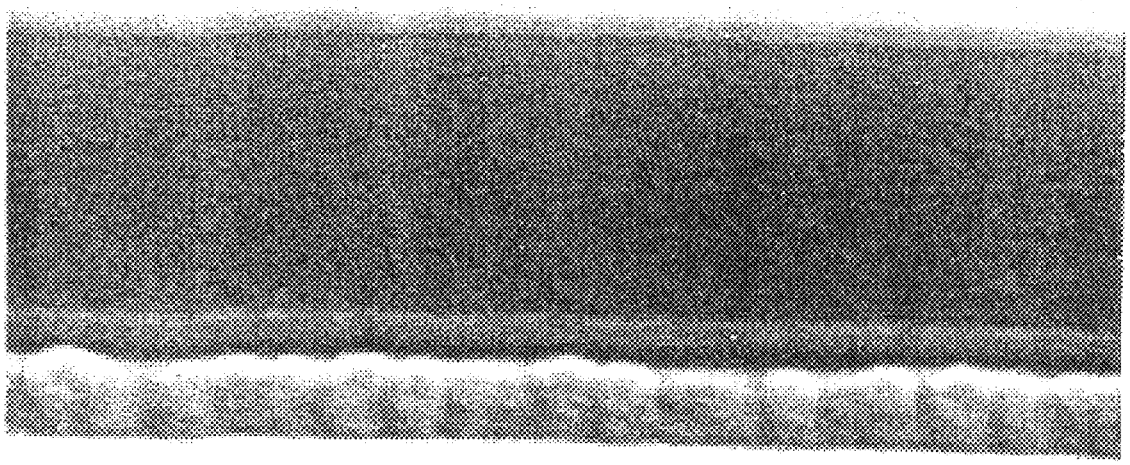
FIGS. 25c and 25d are photomicrographs of the substrate of FIG. 23b after a subsequent densified fluid cleaning step.
Figure 25D:
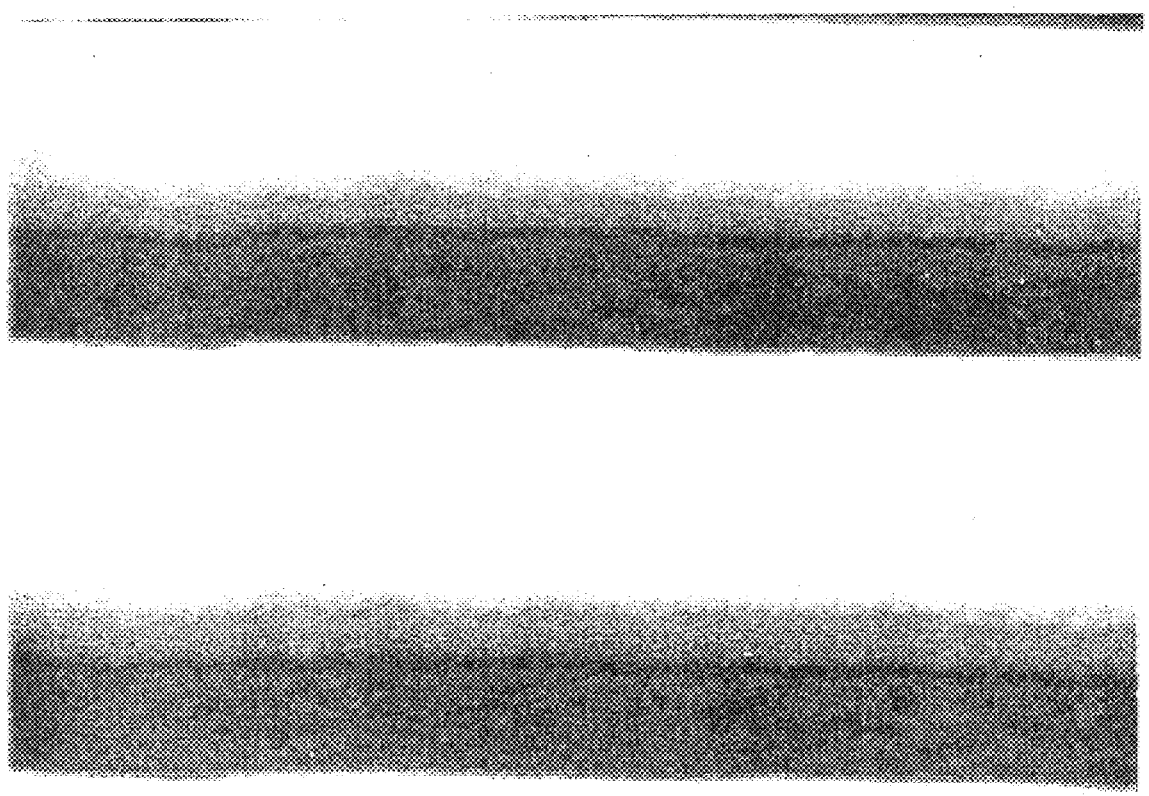

FIGS. 25c and 25d show the substrate of FIG. 25b after the DFC process from different angles. The top of the metal lines and the trench surfaces were free of photoresist and residues. The metal lines were undamaged.

The present invention can be used to effectively and efficiently remove adherent matrix layers such as post-etch residues. It will be understood that the above-described arrangements of apparatus and methods therefrom are merely illustrative of applications of the principles of this invention and many other embodiments and modifications may be made without departing from the spirit and scope of the invention. For example, alternate embodiments can be devised by varying the process parameters for the plasma cleaning process and the DFC process, or by using multiple plasma cleaning steps or multiple DFC steps or both alternately. The scope of the invention should, therefore, be determined not with reference to the above description, but instead should be determined with reference to the appended claims along with their full scope of equivalents.

What is claimed is:

1. A method of removing an adherent matrix from a substrate surface of a substrate, the method comprising:

placing the substrate in a cleaning chamber;

delivering a vapor phase solvent to the cleaning chamber to allow penetration of the vapor phase solvent into the adherent matrix;

cooling the substrate to a substrate temperature which is sufficiently low to condense the vapor phase solvent into the adherent matrix to disrupt the adherent matrix to produce fragments; and transmitting sonic energy to the adherent matrix through the solvent condensed on the adherent matrix to loosen fragments and particles on the substrate.

2. The method of claim 1 wherein the sonic energy comprises megasonic energy.

3. The method of claim 1 wherein transmitting sonic energy comprises placing a transmission member in contact with the condensed solvent and vibrating the transmission member.

4. The method of claim 3 wherein the transmission member comprises an elongated probe which contacts a portion of the condensed solvent on the adherent matrix.

5. The method of claim 4 further comprising rotating the substrate so as to bring the elongated probe in contact with at least a substantial portion of the condensed solvent on the adherent matrix.

6. The method of claim 5 wherein the elongated probe is extended from an edge of the substrate to generally a center of rotation of the substrate.

7. The method of claim 1 further comprising, prior to placing the substrate in the cleaning chamber, exposing the adherent matrix on the substrate to a plasma-activated gas which reacts with the adherent matrix.

8. The method of claim 1 further comprising introducing a co-solvent into the cleaning chamber to allow penetration of the co-solvent into the adherent matrix.

9. The method of claim 1 wherein the co-solvent is soluble in the vapor phase solvent, and wherein introducing the co-solvent and delivering the vapor phase solvent to the cleaning chamber occur at least substantially simultaneously.

10. The method of claim 1 further comprising, prior to delivering the vapor phase solvent to the cleaning chamber, flowing an inert gas through the cleaning chamber to purge the chamber.

* * * * *